United States Patent
Murata

(10) Patent No.: US 9,472,673 B2
(45) Date of Patent: Oct. 18, 2016

(54) THIN FILM TRANSISTOR, METHOD OF MANUFACTURING SAME, AND IMAGE DISPLAY APPARATUS

(71) Applicant: Toppan Printing Co., Ltd., Taito-ku, Tokyo (JP)

(72) Inventor: Kodai Murata, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

(21) Appl. No.: 14/605,395

(22) Filed: Jan. 26, 2015

(65) Prior Publication Data

US 2015/0129862 A1    May 14, 2015

Related U.S. Application Data

(63) Continuation of application No. PCT/JP2013/005311, filed on Sep. 6, 2013.

(30) Foreign Application Priority Data

Sep. 21, 2012  (JP) ................................ 2012-208496
Sep. 21, 2012  (JP) ................................ 2012-208497

(51) Int. Cl.
*H01L 21/02* (2006.01)
*H01L 29/786* (2006.01)
(Continued)

(52) U.S. Cl.
CPC ....... *H01L 29/78606* (2013.01); *G02F 1/1362* (2013.01); *H01L 21/02282* (2013.01);
(Continued)

(58) Field of Classification Search
CPC ................... H01L 21/02623; H01L 29/78606

USPC .................................................. 438/159, 161
See application file for complete search history.

(56) References Cited

U.S. PATENT DOCUMENTS 6,411,350 B2 *   6/2002  Ejiri ............................. 349/149
2003/0061984 A1 *   4/2003  Maekawa ............... C30B 13/00
117/4

(Continued)

FOREIGN PATENT DOCUMENTS

JP    2004-080026 A    3/2004
JP    2005-210086 A    8/2005

(Continued)

OTHER PUBLICATIONS

International Search Report issued in PCT/JP2013/005311 dated Nov. 5, 2013.

*Primary Examiner* — Caridad Everhart
(74) *Attorney, Agent, or Firm* — Foley & Lardner LLP

(57) ABSTRACT

A source electrode (5) and a drain electrode (6) are film-formed, and a semiconductor layer (7) is formed in a substantially stripe shape substantially parallel to the X axis direction (channel-length direction) using a coating method. Then, a protection layer (8) is formed in a substantially stripe shape substantially parallel to the Y axis direction (channel width direction) orthogonal to the semiconductor layer (7). Then, a semiconductor layer (7) portion not covered with the protection layer (8) is removed using an organic solvent or an inorganic solvent or a mixed solution of the organic solvent and the inorganic solvent. Consequently, the semiconductor layer (7) and the protection layer (8) are formed with improved alignment accuracy, and electrical isolation between transistor elements (50) can be achieved with a simplified process.

17 Claims, 9 Drawing Sheets

(51) Int. Cl.
*G02F 1/1362* (2006.01)
*H01L 51/00* (2006.01)
*H01L 51/05* (2006.01)
*H01L 27/12* (2006.01)
*H01L 27/28* (2006.01)
*H01L 21/465* (2006.01)

(52) U.S. Cl.
CPC ....... *H01L21/02623* (2013.01); *H01L 21/465* (2013.01); *H01L 27/124* (2013.01); *H01L 27/127* (2013.01); *H01L 27/1225* (2013.01); *H01L 27/1248* (2013.01); *H01L 27/283* (2013.01); *H01L 29/7869* (2013.01); *H01L 51/0003* (2013.01); *H01L 51/0019* (2013.01); *H01L 51/0545* (2013.01); *H01L 51/0097* (2013.01)

(56) References Cited

U.S. PATENT DOCUMENTS

| | | | |
|---|---|---|---|
| 2003/0124778 A1* | 7/2003 | Doi | H01L 27/1214 438/151 |
| 2004/0129978 A1* | 7/2004 | Hirai | 257/347 |
| 2006/0121643 A1* | 6/2006 | Seo et al. | 438/99 |
| 2009/0057658 A1* | 3/2009 | Shin et al. | 257/40 |
| 2011/0073863 A1* | 3/2011 | Asanuma | H01L 29/04 257/59 |
| 2011/0140097 A1* | 6/2011 | Cheong et al. | 257/43 |
| 2012/0049193 A1* | 3/2012 | Saito et al. | 257/59 |
| 2013/0056738 A1 | 3/2013 | Ikeda et al. | |

FOREIGN PATENT DOCUMENTS

JP  2007-294723 A  11/2007
WO  WO-2011/122205 A1  10/2011

* cited by examiner

THIN FILM TRANSISTOR, METHOD OF MANUFACTURING SAME, AND IMAGE DISPLAY APPARATUS

CROSS-REFERENCE TO RELATED PATENT APPLICATIONS

This application is a continuation application filed under 35 U.S.C. §111(a) claiming the benefit under 35 U.S.C. §§120 and 365(c) of PCT International Application No. PCT/JP2013/005311 filed on Sep. 6, 2013, which is based upon and claims the benefit of priority of Japanese Application No. 2012-208496 filed on Sep. 21, 2012 and Japanese Application No. 2012-208497 filed on Sep. 21, 2012, the entire contents of which are hereby incorporated by reference in their entireties.

BACKGROUND

1. Technical Field

The present invention relates to a thin film transistor, a method of manufacturing the same, and an image display apparatus.

2. Background Art

According to the current state of information technology, information is frequently transmitted from and received with lap top computers or other types of portable information terminals. It is common knowledge that a ubiquitous society enabling information to be exchanged anywhere may be attained in the near future. In such a society, lighter and slimmer information terminals could be desirable. Currently, silicon-based material is mainly employed as a semiconductor material and photolithography is generally used as a manufacturing method.

On the other hand, printable electronics in which an electrical component is manufactured by using a printing technique is attracting attention. By using a printing technique, the following advantages may be attained, that is, equipment cost and manufacturing cost may be reduced compared to using the photolithography and, because a vacuum and a high temperature environment are not necessary, a plastic substrate could be used. Further, this printing technique might be applied to a wide range of fields, not only to thin and light flexible displays but such as also to RFID (Radio Frequency Identification) tags and sensors. Thus, research into printable electronics could be important.

To form a semiconductor layer from solution, methods such as but not limited to a spin coating method, a dipping method, and an ink jet method can be applied. Among these methods, in a transistor array in which a plurality of transistors are arranged, each being manufactured with the spin coating method or the dipping method, because current is likely to flow in the semiconductor layer between transistor elements or between transistors and pixel electrodes, current (leak current) in the Off state becomes larger, which causes a problem with the On-Off ratio being decreased.

Therefore, for example, in patent literature 1, a semiconductor layer is formed at a desired location by using the ink jet method, whereby electrical isolation between the transistor elements is accomplished. Moreover, for example, in patent literature 2, a semiconductor solution is injected into a channel portion located between a source electrode and a drain electrode, whereby electrical isolation between the transistor elements is accomplished.

CITATION LIST OF PATENT LITERATURE

Patent Literature 1: JP-A-2005-210086
Patent Literature 2: JP-A-2004-80026

SUMMARY OF THE INVENTION

Technical Problem

However, in the method according to patent literature 2, it is necessary to form a barrier in order to inject the semiconductor solution. Hence, in addition to an ordinary manufacturing process of the transistor, other manufacturing process steps, i.e., forming a barrier material and a patterning step, are required.

Moreover, electrical isolation between the transistor elements has to be produced in order to improve and stabilize the device characteristics of the thin film transistor. In the methods according to patent literatures 1 and 2, to form a semiconductor layer electrically isolated between every transistor element, it is necessary to consider a deviation of alignment for two axis directions (e.g., the X axis direction and the Y axis direction) so high accuracy is required, thereby causing an accompanying difficulty of manufacturing.

Here, the present invention has as one of its objects to provide a thin film transistor which can be manufactured more easily with improved precision, a method for manufacturing the same, and an image display apparatus using the same.

Solution to Problem

To attempt to ameliorate the problems set forth above, a thin film transistor according to one aspect of the present invention is a thin film transistor including a substrate and a plurality of transistor elements formed on the substrate, characterized in that each of the transistor elements includes: a gate electrode formed on the substrate; a gate insulation layer formed on the substrate, covering the gate electrode; a source electrode and a drain electrode which are formed on the gate insulation layer; a semiconductor layer formed on the source electrode, the gate insulation layer and the drain electrode, extending from the source electrode to the drain electrode along the gate insulation layer; and a protection layer formed on the semiconductor layer, in which the protection layer is formed in a substantially stripe shape over each of the transistor elements, and locations at both ends of the semiconductor layer and locations at both ends of the protection layer are substantially identical in a channel-length direction extending from the source electrode to the drain electrode in each of the transistor elements or in a direction that crosses the channel-length direction when seen in planar view.

The thin film transistor according to another aspect of the present invention is a thin film transistor including a substrate and a plurality of transistor elements formed on the substrate, characterized in that each of the transistor elements includes: a gate electrode formed on the substrate; a gate insulation layer formed on the substrate, covering the gate electrode; a source electrode and a drain electrode which are formed on the gate insulation layer; a semiconductor layer formed on the source electrode, the gate insulation layer and the drain electrode, extending from the source electrode to the drain electrode along the gate insulation layer; and a protection layer formed on the semiconductor layer, in which the protection layer crosses a channel-length direction extending from the source electrode to the drain electrode in each of the transistor elements when seen in planar view, the protection layer being formed in a substantially stripe shape over each of the transistor elements and locations at both ends of the semiconductor layer, and locations at both ends of the protection layer are substantially identical in the channel-length direction when seen in planar view.

In yet another aspect of the present invention, the thin film transistor is a thin film transistor including a substrate and a plurality of transistor elements formed on the substrate, characterized in that each of the transistor elements includes: a gate electrode formed on the substrate; a gate insulation layer formed on the substrate, covering the gate electrode; a source electrode and a drain electrode which are formed on the gate insulation layer; a semiconductor layer formed on the source electrode, the gate insulation layer and the drain electrode, extending from the source electrode to the drain electrode along the gate insulation layer; and a protection layer formed on the semiconductor layer, in which the protection layer is formed to be substantially parallel to a channel-length direction extending from the source electrode to the drain electrode in each of the transistor elements, the protection layer being formed in a substantially stripe shape over each of the transistor elements, and locations at both ends of the semiconductor layer and locations at both ends of the protection layer are substantially identical in a direction that crosses the channel-length direction when seen in planar view.

The above-described thin film transistor may be characterized in that the semiconductor layer is made of an organic semiconductor material.

The above-described thin film transistor may be characterized in that the semiconductor layer is made of an oxide semiconductor material.

The above-described thin film transistor may be characterized in that the protection layer is made of an inorganic compound.

The above-described thin film transistor may be characterized in that the protection layer is made of an organic compound.

The above-described thin film transistor may be characterized in that the protection layer is made of a mixture containing an inorganic compound and an organic compound.

A method of manufacturing the thin film transistor according to one aspect of the present invention is a method of manufacturing a thin film transistor including a plurality of transistor elements formed on a substrate, characterized in that the steps for manufacturing the thin film transistor include: a step for forming a gate electrode on the substrate; a step for forming a gate insulation layer so as to cover the gate electrode; a step for forming a source electrode and a drain electrode on the gate insulation layer; a step for forming a semiconductor layer on the source electrode, the gate insulation layer and the drain electrode to be extended from the source electrode to the drain electrode along the gate insulation layer; a step for forming a protection layer on the semiconductor layer and a step for partly removing the semiconductor layer so as to produce electrically isolation between each of the transistor elements, in which in the step for forming the semiconductor layer, the semiconductor layer is formed in a substantially stripe shape to bridge across a forming region of each of the transistor elements, in the step for forming the protection layer, the protection layer is formed to cross the semiconductor layer when seen in planar view and formed in a substantially stripe shape over the forming region of each of the transistor elements and in the step for partly removing the semiconductor layer, the semiconductor layer is etched by using the protection layer as a mask.

In the above-described method of manufacturing the thin film transistor, the step for forming the semiconductor layer may be characterized in that the semiconductor layer is formed to be substantially parallel to a channel-length direction that extends from the source electrode to the drain electrode in each of the transistor element.

In the above-described method of manufacturing the thin film transistor, the step for forming the semiconductor layer may be characterized in that the semiconductor layer is formed to cross a channel-length direction that extends from the source electrode to the drain electrode in each of the transistor element when seen in planar view.

In the above-described method of manufacturing the thin film transistor, the step for forming the semiconductor layer may be characterized in that the semiconductor layer is formed by a coating method.

In the above-described method of manufacturing the thin film transistor, the step for forming the protection layer may be characterized in that the protection layer is formed by a coating method.

Further, in the above-described method of manufacturing the thin film transistor, the coating method may be characterized by any one of letterpress printing, intaglio printing, lithographic printing, reverse offset printing, screen printing, inkjet, thermal transfer printing, dispenser, spin coating, die coating, microgravure coating and dip coating.

In the above-described method of manufacturing the thin film transistor, the step for partly removing the semiconductor layer may be characterized in that the semiconductor layer is washed away by an organic solvent, an inorganic solvent or a mixed solvent thereof.

Also, in the above-described method of manufacturing the thin film transistor, the step for partly removing the semiconductor layer may be characterized in that the semiconductor layer is removed by being exposed to vapor of any solvent from among an organic solvent, an inorganic solvent and a mixed solvent thereof.

An image display apparatus according to one aspect of the present invention is characterized in that the image display apparatus includes the above-described thin film transistor, an interlayer insulation film formed on the thin film transistor, a pixel electrode formed on the interlayer insulation film and electrically connected to the drain electrode, and a display medium including a common electrode formed on the pixel electrode.

In the above-described image display apparatus, the display medium may be characterized in that the display medium is any one of an electrophoresis-type reflection display apparatus, a transmission-type liquid crystal display apparatus, a reflection-type liquid crystal display apparatus, a transflective liquid crystal display apparatus, an organic EL display apparatus and an inorganic EL display apparatus.

Advantageous Effects of Invention

According to one aspect of the present invention, in a process that manufactures the thin film transistor, the semiconductor layer and the protection layer are formed in the substantially stripe shape in a direction where the semiconductor layer and the protection layer crosses from each other, whereby a deviation of the alignment can be controlled using only one axis direction. As a result, the protection layer can be formed with high accuracy. Moreover, after forming the protection layer, in the semiconductor layer, a portion exposed from under the protection layer is removed, whereby the electrical isolation between the transistor elements can more readily be produced as a self-alignment. Accordingly, the thin film transistor can readily be produced with higher accuracy.

DETAILED DESCRIPTION

Hereinafter, with reference to the drawings, the thin film transistor according to a first embodiment of the present invention will now be described. It should be noted that portions having substantially identical configuration in the respective drawings described as below are labeled as the same symbols and repetitive explanation thereof is omitted.

First Embodiment

Configuration

Figure 1:
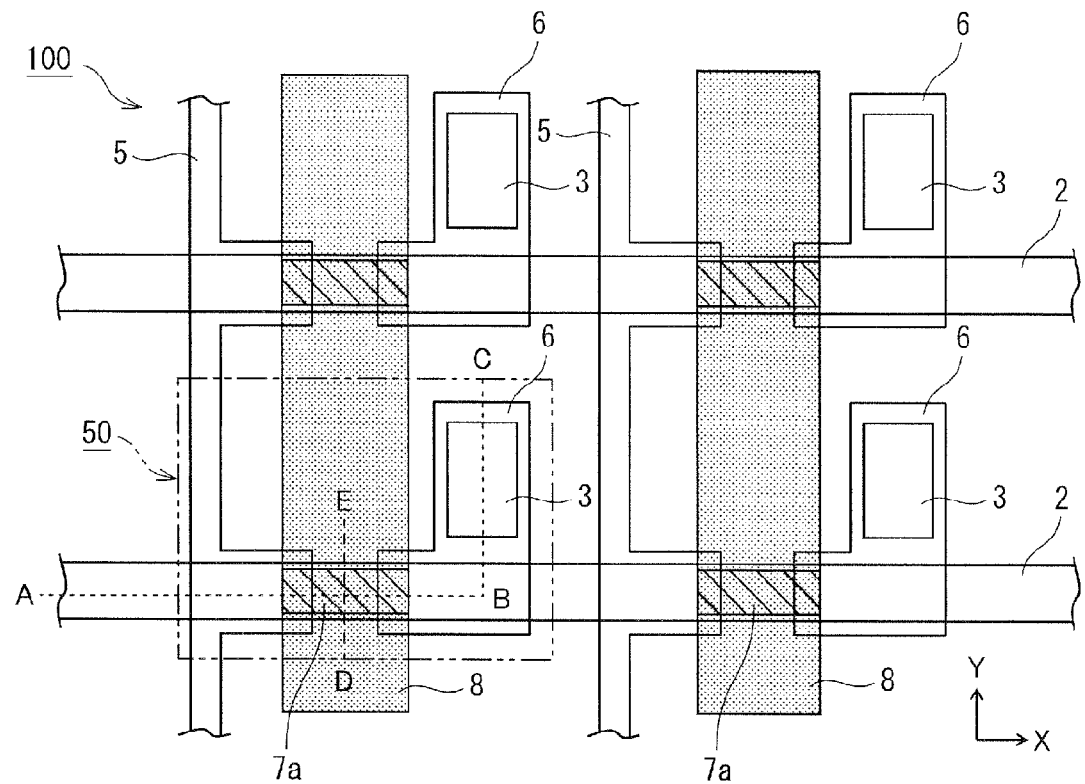
FIG. 1 is a planar view showing a configuration example of a thin film transistor 100 according to the first embodiment of the present invention.
Figure 2:
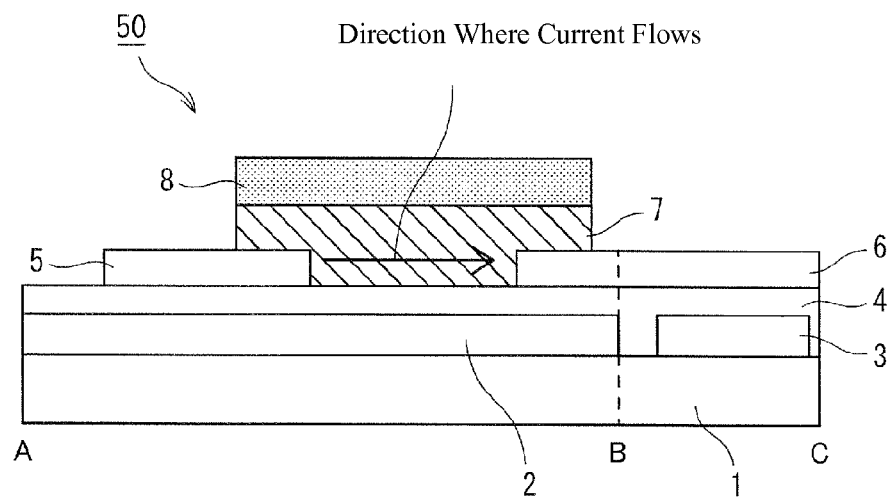
FIG. 2 is a cross-sectional view taken along a line A-B-C in FIG. 1.
Figure 3:
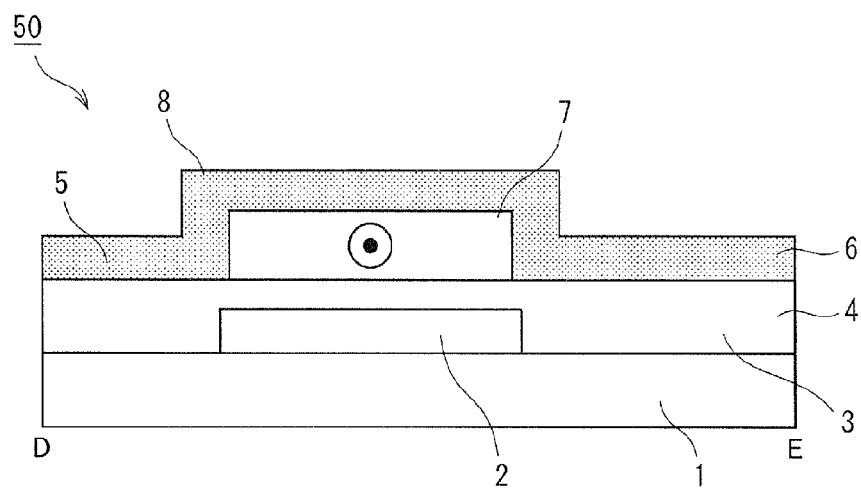
FIG. 3 is a cross-sectional view taken along a line D-E in FIG. 1.

FIG. 1 is a planar view (perspective view) showing a configuration example of the thin film transistor 100 according to the first embodiment of the present invention. FIG. 2 is a cross-sectional view in which a portion 50 corresponding to one pixel (hereinafter referred to transistor element) is cut along a line A-B-C in the thin film transistor 100 as shown in FIG. 1. FIG. 3 is a cross-sectional view in which the transistor element 50 is cut along a line D-E. In FIG. 1, to avoid complicating the drawing, an illustration of the gate insulation layer 4 is omitted. In FIG. 2, the cross-section A-B and the cross section B-C which is orthogonal to the cross-section A-B are illustrated schematically as a subsequent single cross-section. Moreover, in FIG. 3, a symbol in which a black circle is disposed in a white circle schematically illustrates a current that flows from the reverse side of the paper to the right side of the paper.

As shown in FIG. 1, the thin film transistor 100 according to the first embodiment of the present invention is provided with a plurality of transistor elements 50 arranged in a vertical direction and a horizontal direction in a planar view, the plurality of transistor elements 50 being arranged on the same substrate. As shown in FIG. 2 and FIG. 3, each of the transistor elements 50 is a bottom gate/bottom contact type transistor and includes a gate electrode 2 and capacitive electrode 3 that are formed on a substrate 1; a gate insulation layer 4 formed on the substrate 1, covering the gate electrode 2 and the capacitive electrode 3; a source electrode 5 and a drain electrode 6 that are formed on the gate insulation layer 4; a semiconductor layer 7 formed on the source electrode 5, the gate insulation layer 4 and the drain electrode 6, extending from the source electrode 5 to the drain electrode 6 along the gate insulation layer 4; and a protection layer 8 formed on the semiconductor layer 7.

In the thin film transistor 100, the protection layer 8 is formed in a substantially stripe shape over the plurality of transistor elements 50. The substantially stripe shape of the protection layer 8 is orthogonal to a channel-length direction extending from the source electrode 5 to the drain electrode 6 of the respective transistor elements 50 when seen in planar view. It should be noted that the channel-length direction is a direction substantially parallel to a direction where current flows in the semiconductor layer 7, which is the X-axis direction substantially parallel to the line A-B as shown in FIG. 1.

Also, in the thin film transistor 100, locations at both ends of the semiconductor layer 7 in the X-axis direction and locations at both ends of the protection layer 8 are substantially identical when seen in planar view. Here, being substantially identical includes not only a case where the end portions are completely identical or substantially identical but includes a case where the protection layer 8 is slightly protruded outward from on the semiconductor layer 7. This is because, depending on a method of removing the semiconductor 7 which is described later, removing solution or removing vapor slightly enters inside the semiconductor layer 7 which is covered by the protection layer 8 so that the semiconductor layer 7 covered by the protection layer 8 is slightly removed. The material used for the above-described respective portions that constitute the thin film transistor 100 is described as follows.

Preferably, the substrate 1 is has flexibility. As a material of the substrate 1, for example, plastic material such as polyethylene-terephthalate (PET), polyimide, polyethersulfone (PES), polyethylene-naphthalate (PEN) and polycarbonate are given. A glass substrate made of quartz or a silicon wafer can be used as an insulation substrate. However, taking requirements of thinness, light weight and flexibility into consideration, a plastic substrate may preferably be used. Also, taking a temperature used for each manufacturing process into consideration, as a substrate 1, particularly, PEN or polyimide may preferably be used. Because the substrate 1 is flexible, a thin film transistor 100 can be formed with which is flexible, light in weight and thin. Further, even in a device using the thin film transistor 100, these advantages may be obtained.

The materials used for the gate electrode 2 and the capacitor 3 are not limited to specific materials. However, for example, materials including a metal such as gold, platinum, aluminum, nickel and indium tin oxide (ITO); a thin film made of oxide; a conductive polymer such as poly (ethylenedioxythiphene)/polyethylene sulfonate (PEDOT/PSS) and polyaniline; a solution in which metal colloidal particle such as gold, silver and nickel are dispersed; and a thick film paste in which a metal particle such as silver is used as a conductive material are given.

Regarding the material used for the gate insulation layer 4, a polymer solution such as polyvinyl phenol, polyimide and polymethylmethacrylate or a solution in which particles such as alumina and silica gel are dispersed can be used. As for the method for forming the gate insulation layer 4, spin coating or die coating can be used. Thin film materials such as PET, PEN, PES may be used for the gate insulation layer 4. Moreover, by using various insulation materials such as $SiO_2$, SiN, SiON, $Al_2O_3$, the gate insulation layer 4 can be formed for example by a sputtering method, plasma CVD method, or vacuum deposition method.

The materials of the source electrode 5 and the drain electrode 6 are not limited to specific materials. However, for example, materials including a metal such as gold, platinum, aluminum, nickel and indium tin oxide (ITO); a thin film made of an oxide; a conductive polymer such as poly (ethylenedioxy thiofen)/polyethylene sulfonate (PEDOT/PSS) and polyaniline; a solution in which metal colloidal particle such as gold, silver and nickel are dispersed; and a thick film paste in which metal particle such as silver is used as a conductive material are given.

To improve the work function of the source electrode 5 and the drain electrode 6, surfaces of the source electrode 5 and the drain electrode 6 may be surface-treated with a compound containing an electron-attracting group. The compound containing the electron-attracting group used for the surface-treatment of the source electrode 5 and the drain electrode 6 is not limited to a specific compound. However, a thiol compound such as benzenethiol, chlorobenzenethiol, bromobenzenethiol, fluorobenzenethiol, pentafluorobenzenethiol, pentachlorobenzenethiol, nitrothiophenol, 2-mercapto-5-nitrobenzimidazole, perfluorodecanethiol, pentafluorothiophenol, 4-trifluoromethyl-2,3,5,6-tetrafluorothiophenol and 5-chloro-2-mercaptobenzimidazole, a disulfide compound such as diphenyl disulfide, a sulfide compound such as diphenylsulfide, or a silane coupling agent such as a long-chain fluoroalkylsilane can be used.

As a method of the surface-treatment, it is given a method using a solution in which the above-described compounds are dissolved/diluted with a solvent of alcohol such as methanol, ethanol, isopropyl alcohol and immersing the surfaces of source electrode 5 and the drain electrode 6 in a container being filled up with the solution, thereby being surface-treated; a spray method in which a spray blows the above-described solution onto the surfaces of the source electrode 5 and the drain electrode 6, a method in which the above-described solution is coated by various wet coating method such as die coating or spin coating; and a method in which the above-described compounds are laminated by various dry coating methods such as deposition. However, the surface-treatment is not limited to the above-described methods.

Regarding the compounds containing the electron-attracting group, because they adhere well to the source electrode and the drain electrode, a thiol compound, a disulphide compound, a sulfide compound and a silane coupling agent may preferably be used. Further, it is preferable that compounds containing a functional group of the electron-attracting group are chemically bonded with the source electrode 5 and the drain electrode 6. When the compounds containing an electron-attracting functional group have a chemical bond with the source electrode 5 and the drain electrode 6, the work function of the source electrode 5 and the drain electrode 6 can be kept large over a long period of time. Accordingly, a thin film transistor can be produced that, even after aging, is stable and retains a high carrier injection efficiency.

It is preferable that the semiconductor layer 7 is constituted by an organic semiconductor material or an oxide semiconductor material, which are made of, for example, a material containing organic compound as a principal component or a material containing metallic oxide. Because an organic semiconductor or an oxide semiconductor is soluble in some of the organic solvent, the semiconductor layer 7 can be formed by a printing method. However, the semiconductor layer 7 may be formed by dispersing the semiconductor material as particles without it being dissolved into a solution, and by drying/baking the semiconductor material after printing using dispersion. As an organic semiconductor material, polythiophene, polyallylamine, fluorenebithiophene-copolymer and polymer-based organic semiconductor materials which are similar to these derivatives, or pentacene, tetracene, copper phthalocyanine, perylene and low-molecule-based organic semiconductor material which are similar to these derivatives may be used. However, considering requirements of low cost, flexibility and large area, it is preferable to use an organic semiconductor material to which the printing method can be applied. Also, carbon compounds such as carbon nanotubes or fullerenes or semiconductor nano-sized particle dispersions may be used as a semiconductor material. As an oxide semiconductor material, a metal chloride such as zinc, indium and gallium chloride, or metal acetates or metal nitrates can be used as well.

The material of the protection layer 8 is not limited to any specific material, however, and the material of the protection layer 8 is constituted by, for example, a material containing an organic compound as a principal component or a material containing an inorganic compound as a principal component or a material containing a mixture of inorganic compound and an organic compound as a principle component. As a material generally used for the protection layer 8, fluorine-based resin, for example, condensed fluorine-containing polymer such as fluorine acrylic resin and fluorine-containing polyimide, or fluorine-containing ether polymer and fluorine-containing cyclic ether polymer are given. These materials may contain a perfluoro group which is fully fluorine-substituted or may be a material in which rest of fluorine-substitution is substituted by chlorine, etc. These materials may have a trifluoromethane substitution. Moreover, it is considered that materials such as polyimide, polyamide, polyester, polyvinyl phenol, epoxy resin, benzocyclobutene resin, phenol resin, acrylic resin, fluororesin and mixtures of these can be given. However, it is not limited to these materials. Further, a light shielding property can be applied to the protection layer 8 as needed.

(Manufacturing Method)

The manufacturing method of the thin film transistor 100 as shown in FIG. 1 will now be described as follows.

Figure 4:
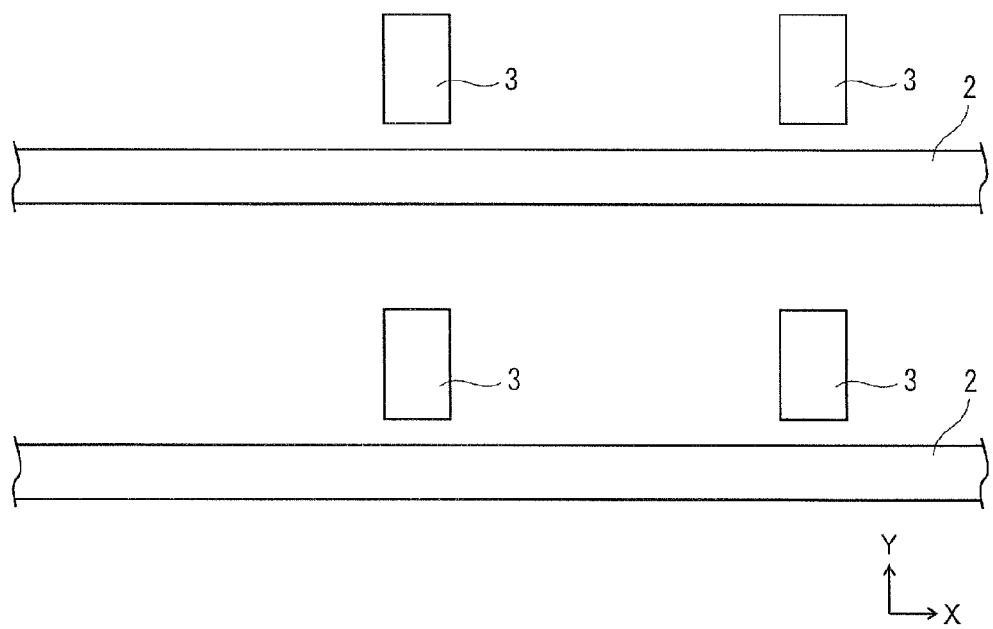
FIG. 4 is a planar view showing a manufacturing method of the thin film transistor 100 in manufacturing step order.
Figure 5:
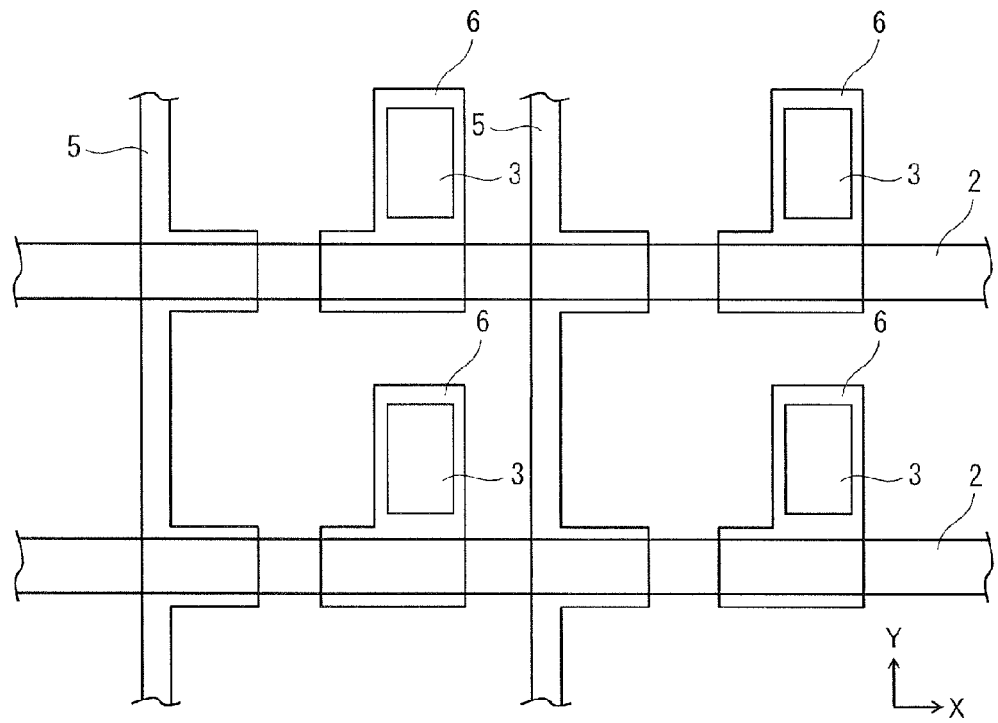
FIG. 5 is a planar view showing a manufacturing method of the thin film transistor 100 in manufacturing step order.

FIGS. 4 to 7 are planar views showing a manufacturing method of the thin film transistor 100 according to the first embodiment of the present invention in manufacturing step order. In FIGS. 4 to 7, to avoid complicating the drawings, an illustration of the gate insulation layer 4 is omitted. First, an overall manufacturing process of the thin film transistor 100 is described. As shown in FIG. 4, the gate electrode 2 and the capacitive electrode 3 are formed on the substrate 1. Here, the gate electrode 2 is formed, for example, in a substantially stripe shape to be substantially parallel to the X-axis direction. Next, the gate insulation layer 4 (not shown) is formed on the substrate 1. Then, as shown in FIG. 5, the source electrode 5 and the drain electrode 6 are formed.

Figure 6:
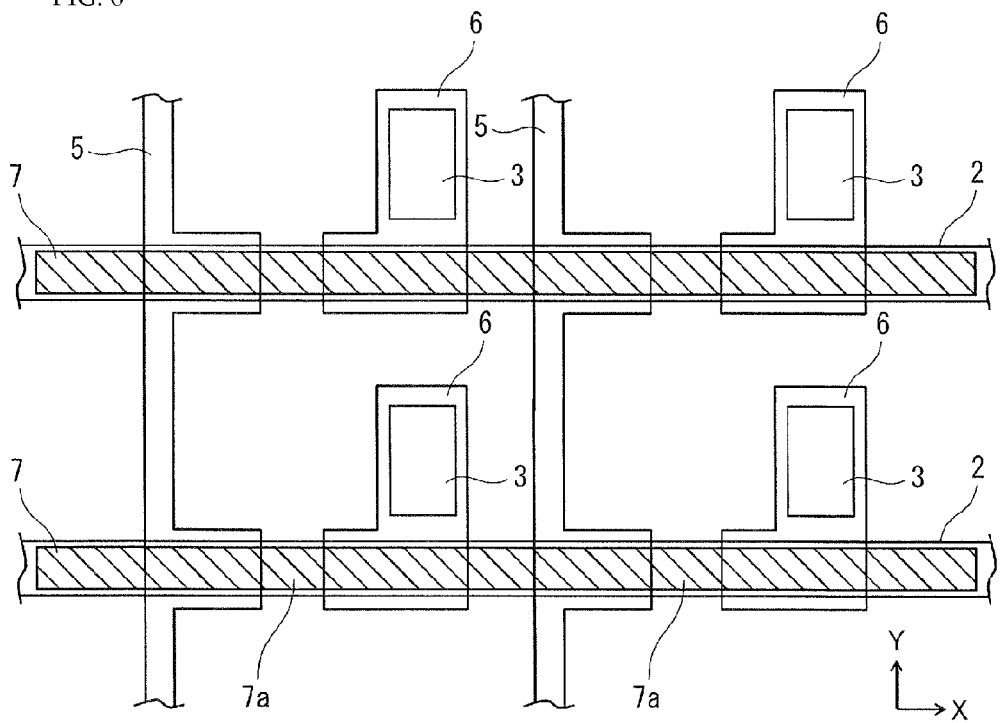
FIG. 6 is a planar view showing a manufacturing method of the thin film transistor 100 in manufacturing step order.
Figure 7:
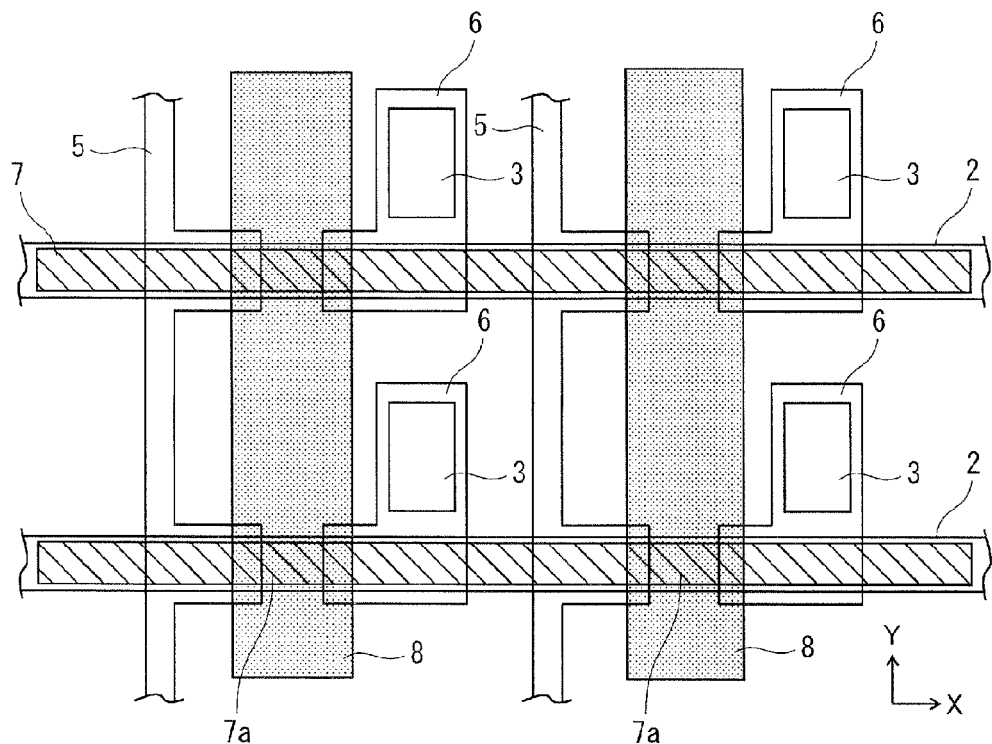
FIG. 7 is a planar view showing a manufacturing method of the thin film transistor 100 in manufacturing step order.

Subsequently, as shown in FIG. 6, the semiconductor layer 7 is formed to be substantially parallel to the X-axis direction to be overlapped with the gate electrode 2 and formed in a substantially stripe shape over a forming region of each of the transistor elements 50. In the semiconductor layer 7, a portion located between the source electrode 5 and the drain electrode 6 is a channel portion 7a. Then, as shown in FIG. 7, the protection layer 8 is formed to be substantially parallel to the Y-axis direction (i.e., a direction substantially parallel to the line D-E as shown in FIG. 1, and the channel width direction) which is orthogonal to the X-axis direction in a planar view and formed in a substantially stripe shape over the forming region of each of the transistor elements 50. Here, the protection layer 8 is formed so as to cover above the channel portion 7a. Then, by using the protection layer 8 as a mask, in the semiconductor layer 7, a portion exposed from under the protection layer 8 is etched and removed. Thus, the thin film transistor 100 as shown in FIG. 1 is completed.

The above-described respective manufacturing steps will now be further described in detail as follows.

According to a first embodiment of the present invention, it is preferable that at least one of the manufacturing steps for forming the gate electrode 2, the capacitor 3, the source electrode 5, the drain electrode 6, the semiconductor layer 7 and the protection layer 8 is performed by a printing method. This is because the printing method is useful in forming the thin film transistor 100 with lower cost. For example, compared to forming the gate electrode 2, capacitive electrode 3, source electrode 5, the drain electrode 6, the semiconductor layer 7 and the protection layer 8 with a vacuum deposition method, a sputtering method, a photolithography and an etching, the number of manufacturing steps can be reduced, and because vacuum processing is not used, the manufacturing cost can be reduced. The printing method is not limited to a specific method, however, letterpress printing, intaglio printing, lithographic printing, reverse offset printing, screen printing, inkjet, thermal transfer printing, dispenser and coating methods such as spin coating, die coating, microgravure coating and dip coating are given as examples.

Specifically, letterpress printing is desirable for forming the semiconductor layer 7. When using an organic semiconductor or an oxide semiconductor, a printing method can be applied for forming the semiconductor layer 7 by using dissolved solution or dispersed solution. However, an organic semiconductor solution or oxide semiconductor solution usually has low viscosity due to low solubility thereof. Therefore, usable printing methods are limited to letterpress printing or ink jet method. As for the ink jet method, because the viscosity of the ink is significantly low, when a fine pattern is required to be formed, it is necessary to strive to avoid the solution from spreading. Generally, by using a photolithography or a screen printing method, a bank needs to be provided in advance. On the other hand, because the letterpress printing does not require such a bank, it can be more preferable to use this letterpress printing.

It may be desirable to use the letterpress printing for forming the protection layer 8 similar to the semiconductor layer 7. As shown in FIG. 6, the semiconductor layer 7 is preferably formed in a substantially stripe shape over a plurality of channel portions (between the source electrode and the drain electrode). Thus, compared to a dotted shape, the thin film transistor 100 can be manufactured with higher throughput and higher alignment accuracy, and thin film transistors 100 having less variation between transistor elements and having a higher On-Off ratio may be manufactured.

When the semiconductor layer is formed with small dots as an isolation pattern, a deviation of the alignment, which can be caused by a transfer failure due to a defect of the plate or a discharge failure due to clogging of a nozzle, can occur in both the X-axis direction and the Y-axis direction when the thin film transistor 100 is viewed two-dimensionally from above. Hence, it may be difficult to secure alignment accuracy, thereby causing a decrease in the yield. In this respect, it is desirable to form the semiconductor layer in the substantially stripe shape. Formed in the substantially stripe shape, deviation of the alignment can be controlled using only one axis direction so that the alignment accuracy is improved, and then thin film transistor 100 having high yield can be manufactured. In particular, when manufacturing the thin film transistor 100 having large area, a significant advantage may be obtained.

For example, in a bottom contact structure, when forming the semiconductor layer having dotted shapes by using a wet process, if wettability of the surface of the electrode is high compared to the surface of the insulating film, the semiconductor layer is pulled by the electrode portion and a wiring to cause for example insufficient thickness, whereby a failure in which the channel portion is not well formed is likely to occur. By forming the semiconductor layer in the substantially stripe shape, an amount of the semiconductor solution increases, whereby the channel portion can be favorably formed. Taking an adhesive property of the semiconductor layer into consideration, comparing the dotted shapes and the substantially stripe shapes, the substantially stripe shapes have a larger contact area with the substrate, and therefore adhesion with the semiconductor layer is improved.

Figure 17:
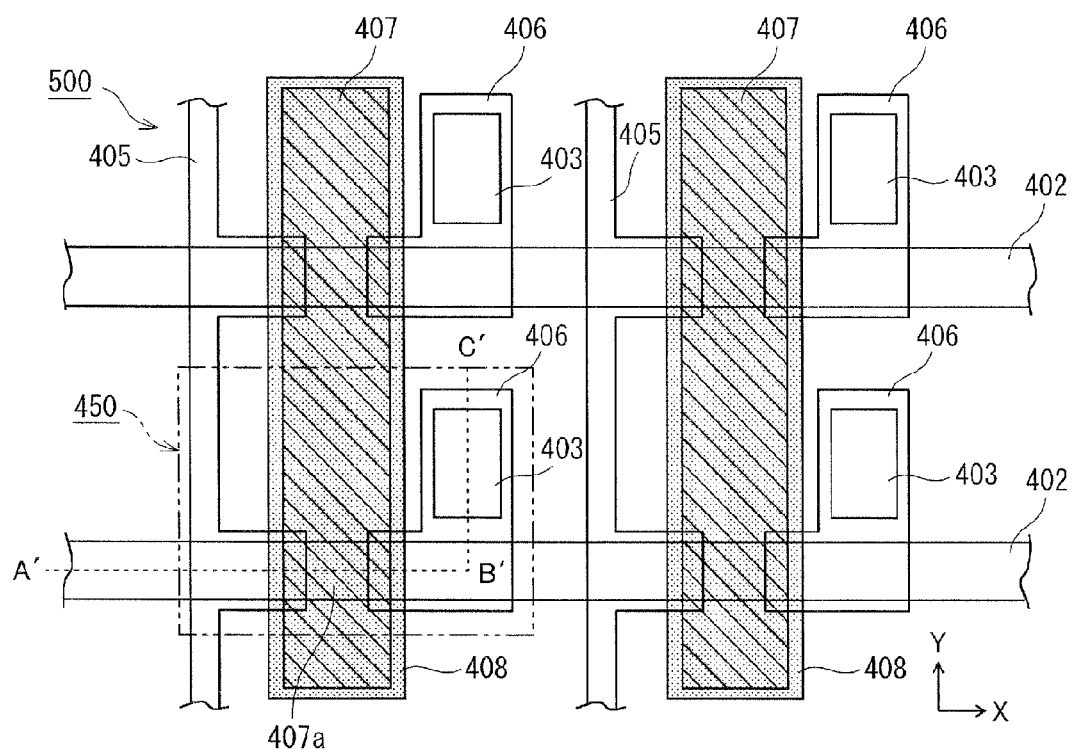
FIG. 17 is a planar view showing a configuration example of the thin film transistor 500 according to the comparative example of the present invention.
Figure 18:
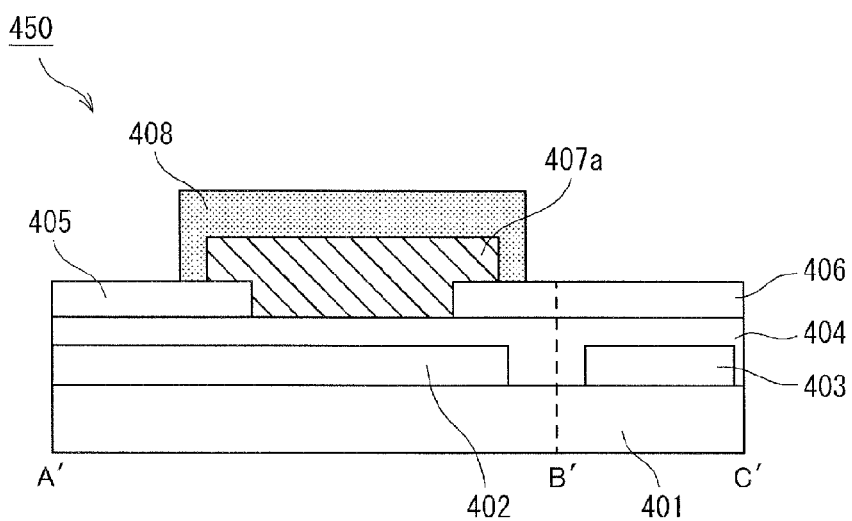
FIG. 18 is a cross-sectional view cut along a line A'-B'-C' in FIG. 18.

The semiconductor layer 7 is formed in a substantially stripe shape which is substantially parallel to the X-axis direction. In this case, in the Y-axis alignment in FIG. 5, assuming the semiconductor layer 7 is overlapped with at least part of the gate electrode 2, conduction between the source electrode 5 and the drain electrode 6 can be secured so that the yield of the thin film transistor 100 can be improved. On the other hand, the semiconductor layer 7, as shown in FIG. 17 which is described later, is formed in a substantially stripe shape which is substantially parallel to the Y-axis direction and when the semiconductor layer is shifted in either right or left direction, the semiconductor layer does not contact with the source electrode 5 or the drain electrode 6 so that conduction at the channel portion cannot be produced, whereby the yield is likely to decrease. Therefore, a comparative morphology as shown in FIG. 17 and FIG. 18 requires an alignment accuracy relatively higher than that of the first embodiment of the present invention.

The width of the semiconductor layer 7 having substantially stripe shape is not specifically limited. However, in FIG. 7, because the portion exposed from under the semiconductor layer 7 (i.e., portion not covered by the protection layer 8) is removed, the semiconductor layer 7 may be formed extending to a portion in electrical contact with the pixel electrode of the drain electrode 6 (i.e., portion in which the capacitive electrode 3 exists). However, if the semiconductor layer 7 is formed to have a width enabling contact with the semiconductor layer, the source electrode, the drain electrode and the pixel electrode in adjacent transistor element, the protection layer 8 is formed over the adjacent transistor elements. Therefore, the semiconductor layer 7 which is under the protection layer 8 may cause a leak current between transistor elements which are adjacent to each other. Thus, it is desirable that the width of the stripe-shaped semiconductor layer is less than or equal to a width not enabling contact with an adjacent semiconductor layer, the source electrode and the drain electrode.

While the width of the semiconductor layer 7 should be small enough to avoid the above-mentioned problems and avoid wastage of material, the substantially stripe shape should be as wide as otherwise possible, to lower the required alignment accuracy.

Next, as shown in FIG. 7, the protection layer 8 that covers the thin film transistor 100 is preferably formed in a substantially stripe shape to orthogonally cross over a plurality of semiconductor layers 7. Thus, the characteristics of the semiconductor layer 7 are prevented from degrading, and also the thin film transistor 100 can be manufactured to have relatively excellent alignment accuracy and transistor elements capable of being electrically isolated easily.

When the protection layer 8 is formed with small dots as an isolation pattern, a deviation of the alignment, which can be caused by a transfer failure due to defect of the plate or a discharge failure due to clogging of a nozzle, occurs in both the X-axis direction and the Y-axis direction when the thin film transistor 100 is viewed two-dimensionally from above. Hence, it can be more difficult to secure alignment accuracy, thereby causing a decrease in the yield. In this respect, it is desirable to form the semiconductor layer in the substantially stripe shape. Formed in the substantially stripe shape, deviation of the alignment can be controlled using only one axis direction so that the alignment accuracy is improved, and then thin film transistor 100 having high yield can be manufactured. In particular, when manufacturing the thin film transistor 100 having large area, a significant advantage may be obtained.

The width of the stripe-shaped protection layer 8 is not specifically limited. However, it can be preferable to have a width that avoids contact with the pixel electrode, and it is necessary that the protection layer 8 is formed at a position where at least the channel portion is covered.

In FIG. 7, assuming the protection layer 8 contacts a portion to be electrically connected with the pixel electrode of the drain electrode 6 (i.e., portion in which the capacitive electrode 3 exists), an aperture ratio is likely to decrease or conduction with the pixel electrode is likely to be blocked. Further, a similar problem may be likely to happen when the protection layer 8 is formed extending to a portion to be electrically connected with the pixel electrode of an adjacent drain electrode 6. Hence, as a width of the protection layer 8, it can be desirable to set the width to be less than or equal to a width that avoids contact with the drain electrode 6 of the transistor 50 and the drain electrode 6 of an adjacent transistor 50.

While the width of the semiconductor layer 8 should be small enough to avoid the above-mentioned problems and avoid wastage of material, the substantially stripe shape should preferably be as wide as otherwise possible, to lower the required alignment accuracy.

In FIG. 7, after forming the protection layer 8, a portion in the semiconductor layer 7 which is exposed from under the protection layer 8 is removed, thereby electrically isolating adjacent transistor elements 50 from each other. As a method of partly removing the semiconductor layer 7, applying solvent (e.g., organic solvent, inorganic solvent or mixed solvent thereof) that dissolves the semiconductor layer 7, being exposed to vapor of these solvents may be used or a dry processing such as dry etching, plasma processing and UV processing may be used. Further, a portion of the semiconductor layer 7 which is not covered by the protection layer 8 is not only removed, but also a process that deactivates the semiconductor properties to lose the conductivity may be used as well. At this point, needless to say, a processing that might remove the protection layer 8 is avoided.

These processes are applied to the substrate 1 on which the thin film transistor 100 is formed. Accordingly, compared to an isolation method of the transistor elements that requires alignment such as using a laser or erasing, electrical isolation between transistor elements can be produced easily. By these processes, locations at both ends of the semiconductor layer 7 in the the X-axis direction and the locations at both ends of the protection layer 8 in the same direction are substantially identical in the planar view. In other words, when the tip of the semiconductor layer 7 in the X-axis direction is defined as the end portion of the semiconductor layer 7, the end portion of the semiconductor layer 7 is formed to match the end portion of the protection layer 8 in the width direction (i.e., short side direction).

Effects of a First Embodiment

According to the a embodiment of the present invention, in the process of manufacturing the thin film transistor 100, the semiconductor layer 7 is formed to be substantially parallel to the X-axis direction and formed in substantially stripe shape over the forming region of the respective transistor elements 50, whereby the deviation of the alignment can be controlled using only one axis of the Y-axis direction. Similarly, the protection layer 8 is formed to be substantially parallel to the Y-axis direction and formed in a substantially stripe shape over the forming region of the respective transistor elements 50, whereby the deviation of the alignment can be controlled using only one axis direction of the X-axis direction. Thus, the semiconductor layer 7 and the protection layer 8 can be formed with high accuracy. Moreover, after forming the protection layer 8, a portion in the semiconductor layer 7 which is exposed from under the protection layer 8 is removed by using an organic solvent, inorganic solvent or a mixture of these solvents. Thus, electrical isolation between transistor elements 50 can readily be produced as a self-alignment. Therefore, the thin film transistor 100 can readily be manufactured with high precision. Specifically, the structure provides superior alignment accuracy of the semiconductor layer.

(Modification)

It should be noted that the thin film transistor 100 according to the first embodiment of the present invention can be used as a thin film transistor array in which a plurality of transistor elements 50 each corresponding to one pixel element are arranged in a matrix. In the thin film transistor array, components such as an interlayer insulation film, upper pixel electrode, a gas barrier layer, a flattening film and a light shielding film can be formed as necessary. The thin film transistor array can be used as an image display apparatus.

Figure 8:
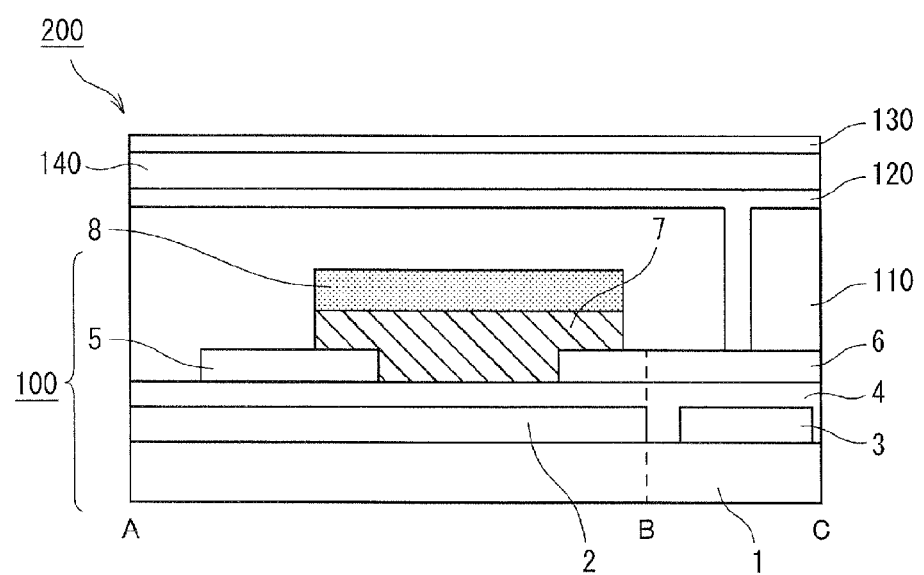
FIG. 8 is a cross-sectional view showing a configuration example of the image display apparatus 200 according to the first embodiment of the present invention.

FIG. 8 is a cross-sectional view showing a configuration example of the image display apparatus 200 according to the first embodiment of the present invention. As shown in FIG. 8, the image display apparatus 200 is provided with, for example, the above-described thin film transistor (thin film transistor array) 100, an interlayer insulation film 110 formed on the thin film transistor 100, a pixel electrode 120 formed on the interlayer insulation film 110 and electrically connected to the drain electrode 6 and a display medium 140 including a common electrode 130 formed on the pixel electrode 120. As a display medium 140, for example, an electronic paper such as an electrophoresis-type reflection display apparatus, an organic EL display apparatus, an inorganic EL display apparatus, a transmission-type liquid crystal display apparatus, a reflection-type liquid crystal display apparatus, a transflective liquid crystal display apparatus and etc. can be used.

Second Embodiment

Configuration

Figure 9:
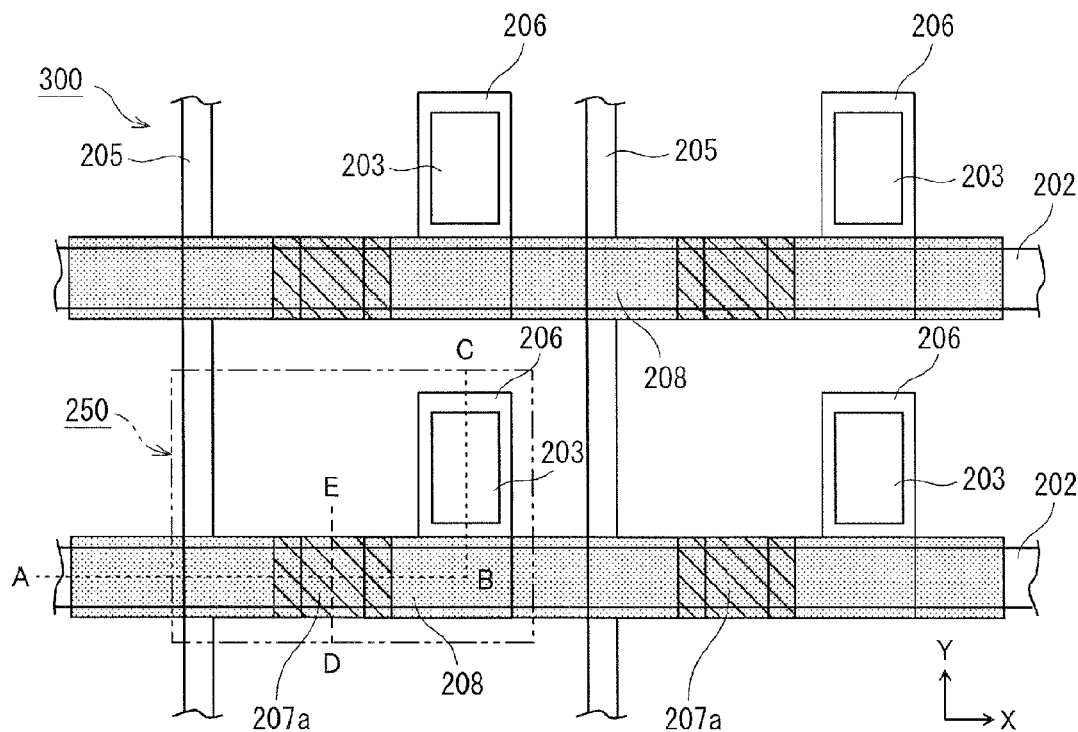
FIG. 9 is a planar view showing a configuration example of the thin film transistor 300 according to a first embodiment of the present invention.
Figure 10:
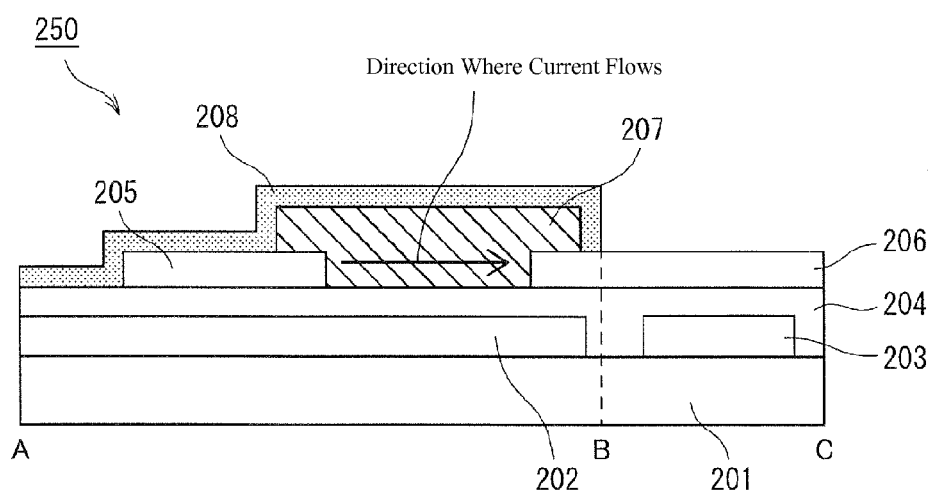
FIG. 10 is a cross-sectional view cut along a line A-B-C in FIG. 9.
Figure 11:
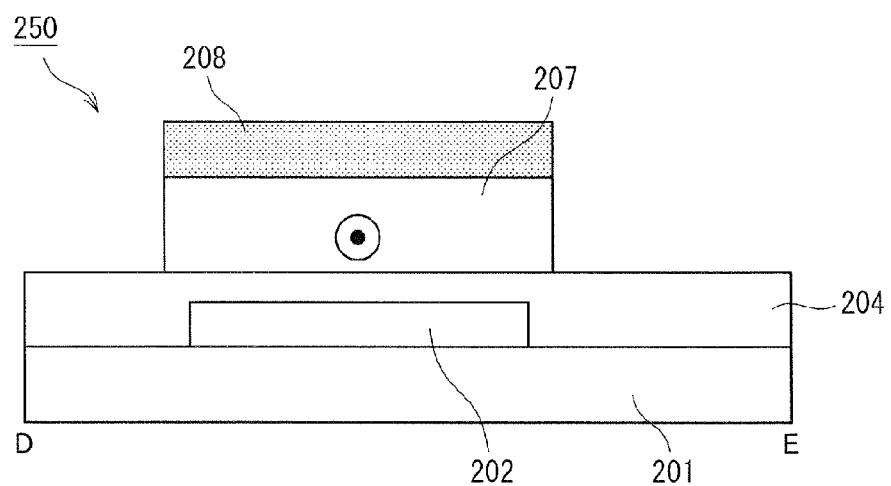
FIG. 11 is a cross-sectional view cut along a line D-E in FIG. 9.

FIG. 9 is a planar view (perspective view) showing a configuration example of the thin-film transistor 300 according to a second embodiment of the present invention. FIG. 10 is a cross-sectional view in which a portion 250 corresponding to, for example, one pixel in the thin film transistor 300 as shown in FIG. 9 (hereinafter referred to as a transistor element) is cut along a line A-B-C. FIG. 11 is a cross-sectional view showing the transistor 250 cut along a line D-E. In FIG. 9, to reduce drawing complexity, an illustration of the gate insulation layer 204 is omitted. Further, in FIG. 10, the A-B section and the B-C section which is orthogonal to the A-B section are illustrated schematically in a continuous section. Also, in FIG. 11, a symbol in which a black circle is disposed in a white circle schematically illustrates a current that flows from the reverse side of the paper to the right side of the paper.

As shown in FIG. 9, the thin film transistor 300 according to the second embodiment of the present invention is provided with a plurality of transistor elements 250 arranged in a vertical direction and a horizontal direction when seen in planar view, the plurality of transistor elements 250 being arranged on the same substrate. As shown in FIG. 10 and FIG. 11, each of the transistor elements 250 is a bottom gate/bottom contact type transistor and includes a gate electrode 202 and a capacitive electrode 203 that are formed on a substrate 201; a gate insulation layer 204 formed on the substrate 201, covering the gate electrode 202 and the capacitive electrode 203; a source electrode 205 and a drain electrode 206 that are formed on the gate insulation layer 204; a semiconductor layer 207 formed on the source electrode 205, the gate insulation layer 204 and the drain electrode 206, extending from the source electrode 205 to the drain electrode 206 along the gate insulation layer 4; and a protection layer 208 formed on the semiconductor layer 207.

In the thin film transistor 300, the protection layer 208 is formed in a substantially stripe shape over the plurality of transistor elements 250. The substantially stripe shape of the protection layer 208 is formed to be substantially parallel to a channel-length direction extending from the source electrode 205 of respective transistor elements 250 to the drain electrode 206 of respective transistor elements 250 when seen in planar view. It should be noted that the channel-length direction is a direction substantially parallel to a direction where current flows in the semiconductor layer 207, which is the X-axis direction substantially parallel to the line A-B as shown in FIG. 9.

Also, in the thin film transistor 300, locations at both ends of the semiconductor layer 207 in the Y-axis direction (i.e., a direction substantially parallel to the line D-E as shown in FIG. 9 which is also the channel-width direction) orthogonal to the X-axis when seen in planar view and locations at both ends of the protection layer 208 in the Y-axis direction are substantially identical when seen in planar view. Here, being substantially identical includes not only a case where the end portions is completely identical or substantially identical but includes a case where the protection layer 208 is slightly protruded outward from on the semiconductor layer 207. This is because, depending on a method of removing the semiconductor 207 which is described later, removing solution or removing vapor slightly enters inside the semiconductor layer 207 which is covered by the protection layer 208 so that the semiconductor layer 207 covered by the protection layer is slightly removed. The material used for the above-described respective portions that constitute the thin film transistor 100 is described as follows.

Preferably, the substrate 201 is has flexibility. The material of the substrate 201, for example, can be the same materials used for the substrate 1 as described in the first embodiment. Because the substrate 201 is flexible, a thin film transistor 300 can be formed that is flexible, lightweight and thin. Further, even in a device using the thin film transistor 300, these advantages can be obtained.

The materials of the gate electrode 202 and the capacitive electrode 203 are not specifically limited. However, for example, the same material same as the gate electrode 2 or the capacitor 3 as described in the first embodiment can be employed. As a material for the gate insulation layer 204, for example, the same type of material as used for the gate insulation layer 4 as described in the first embodiment can be employed. The method of forming the gate insulation layer 204 is, for example, the same as the method of forming the gate insulation layer 4.

The materials of the source electrode 205 and the drain electrode 206 are not specifically limited. However, for example, the same type of material as used for the source electrode 5 and the drain electrode 6 as described in the first embodiment can be employed. To improve the work function of the source electrode 205 and the drain electrode 206, surfaces of the source electrode 205 and the drain electrode 206 may be surface-treated with a compound containing an electron-attracting group. The compound containing the electron-attracting group used for the surface-treatment of the source electrode 205 and the drain electrode 206 is not limited to a specific compound. However, for example, the same type of material of the compound used for the surface-treatment of the source electrode 5 and the drain electrode 6 as described in the first embodiment can be employed. The method of the surface-treatment is not limited to a specific method, but the method used for surface-treating of the source electrode 5 and the drain electrode 6 as described in the first embodiment are given.

Regarding the compounds containing the electron-attracting group, because they adhere strongly to the source electrode and the drain electrode is high, a thiol compound, a disulphide compound, a sulfide compound and a silane coupling agent may preferably be used. Further, it may be preferable that compounds containing a functional group of the electron-attracting group are chemically bonded with the source electrode 205 and the drain electrode 206. When the compounds containing the functional group of the electron-attracting group has a chemical bond with the source electrode 205 and the drain electrode 206, the work function of the source electrode 205 and the drain electrode 206 can be kept large over a long period of time. Accordingly, a thin film transistor can be produced that, even after aging, is stable and retains a high carrier injection efficiency.

The semiconductor layer 207 can be formed with, for example, the same material as used in the semiconductor layer 7 described in the first embodiment and can be formed by the same method such as printing method. The material used for the protection layer 208 is not limited to a specific material, however, the same type of material as used in the protection layer 208 described in the first embodiment can be employed. Similar to the protection layer 8, a light shielding property can be applied to the protection layer as needed.

(Manufacturing Method)

The manufacturing method of the thin film transistor 300 as shown in FIG. 9 will now be described as follows.

Figure 12:
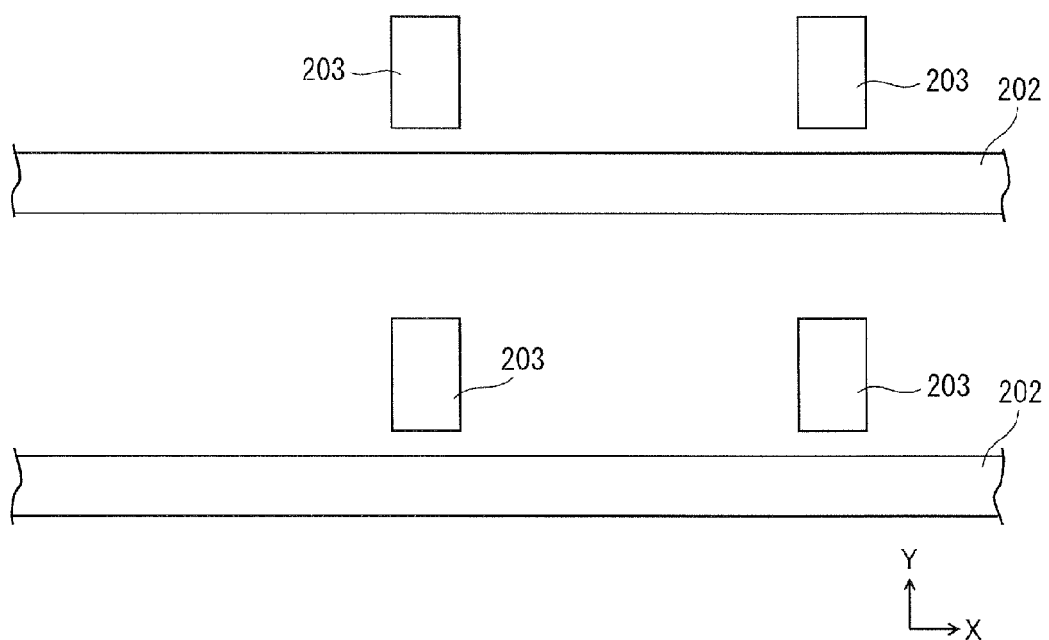
FIG. 12 is a planar view showing a manufacturing method of the thin film transistor 300 in manufacturing step order.
Figure 13:
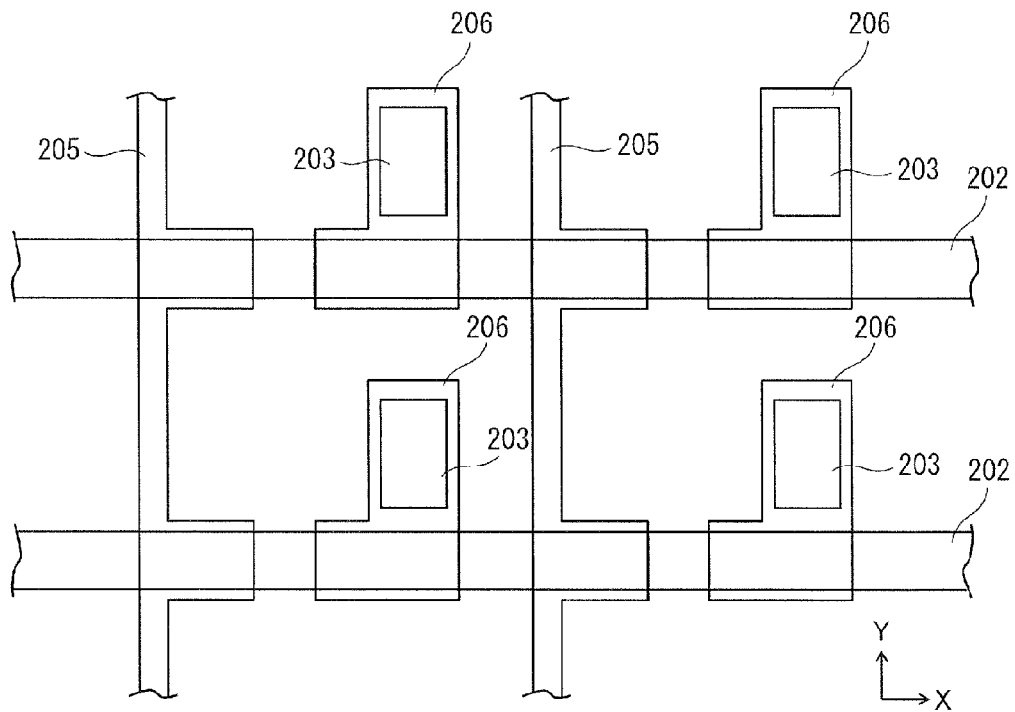
FIG. 13 is a planar view showing a manufacturing method of the thin film transistor 300 in manufacturing step order.

FIGS. 12 to 15 are planar views showing a manufacturing method of the thin film transistor 300 according to the second embodiment of the present invention in manufacturing step order. In FIGS. 12 to 15, to avoid complicating the drawings, an illustration of the gate insulation layer 204 is omitted. First, an overall manufacturing step of the thin film transistor 300 is described. As shown in FIG. 12, the gate electrode 202 and the capacitive electrode 203 are formed on the substrate 201. Here, the gate electrode 202 is formed, for example, in a substantially stripe shape to be substantially parallel to the X-axis direction. Next, the gate insulation layer 204 (not shown) is formed on the substrate 201. Then, as shown in FIG. 13, the source electrode 205 and the drain electrode 206 are formed.

Figure 14:
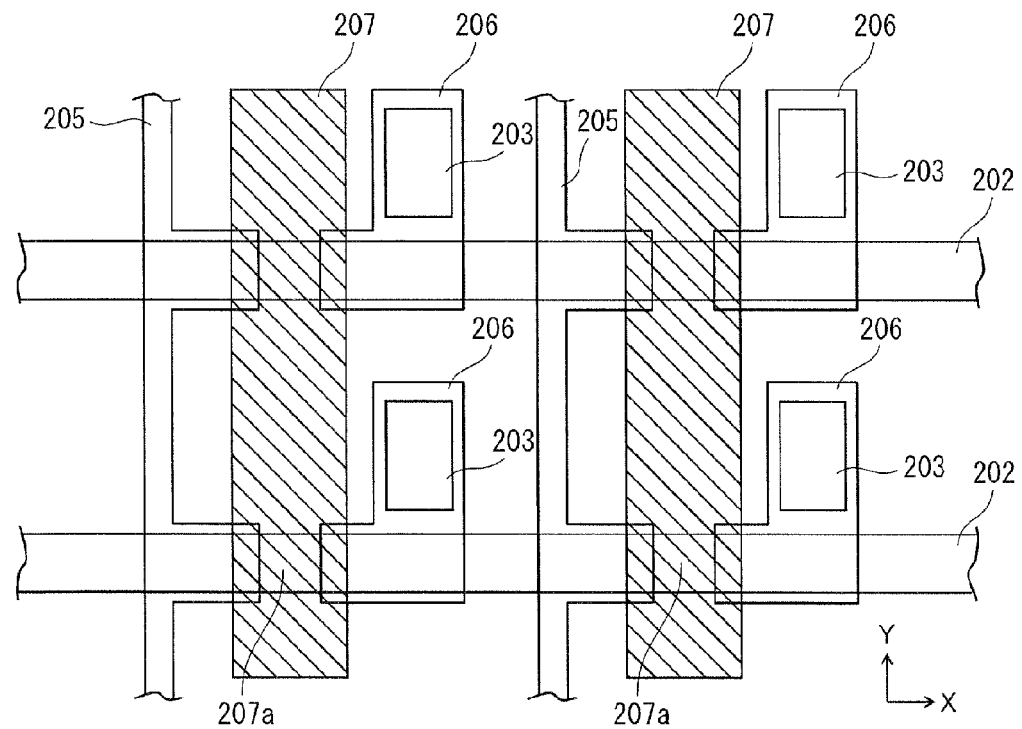
FIG. 14 is a planar view showing a manufacturing method of the thin film transistor 300 in manufacturing step order.
Figure 15:
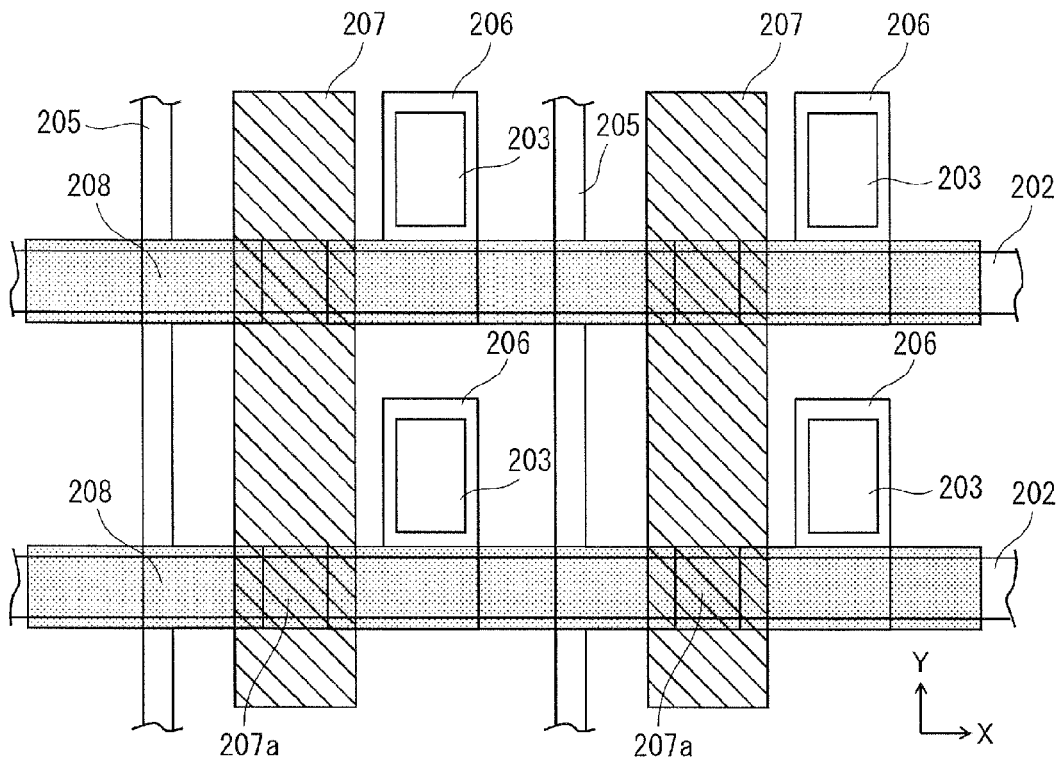
FIG. 15 is a planar view showing a manufacturing method of the thin film transistor 300 in manufacturing step order.

Subsequently, as shown in FIG. 14, the semiconductor layer 207 is formed orthogonally to the X-axis direction (i.e., substantially parallel to the Y-axis direction) to be overlapped with the gate electrode 202 and formed in a substantially stripe shape over a forming region of each of the transistor elements 250. In the semiconductor layer 207, a portion located between the source electrode 205 and the drain electrode 206 is a channel portion 207a. Then, as shown in FIG. 15, the protection layer 208 is formed to be substantially parallel to the X-axis direction and formed in a substantially stripe shape over the forming region of each of the transistor elements 250. Here, the protection layer 208 is formed so as to cover above the channel portion 207a. Then, by using the protection layer 208 as a mask, in the semiconductor layer 207, a portion exposed from under the protection layer 208 is etched and removed. Thus, the thin film transistor 300 as shown in FIG. 9 is completed.

The above-described respective manufacturing steps are now further described in detail as follows.

According to the second embodiment of the present invention, it is preferable that at least one of the manufacturing steps for forming the gate electrode 202, the capacitor 203, the source electrode 205, the drain electrode 206, the semiconductor layer 207 and the protection layer 208 is performed by a printing method. The reason for this is that the printing method is useful in forming the thin film transistor 300 with low cost, similarly to the first embodiment. Particularly, letterpress printing is preferably used for forming the semiconductor layer 207.

It is desirable to use letterpress printing for forming the protection layer 208, similar to forming the semiconductor layer 207. As shown in FIG. 14, the semiconductor layer 207 is preferably formed in a substantially stripe shape over a plurality of channel portions (between the source electrode and the drain electrode). Thus, similar to the first embodiment, compared to a dotted shape, the thin film transistor 300 can be manufactured with high throughput and high alignment accuracy, and thin film transistor 100 having less variation between transistor elements and also having high On-Off ratio can be manufactured.

The semiconductor layer 207 is formed in a substantially stripe shape to be substantially parallel to the Y-axis direction. In this case, in the semiconductor layer 7, a portion formed not to get over the source electrode 205 and the drain electrode 206 is produced (i.e., portion between the source electrode 205 and the drain electrode 206 where the current flows). At this point, the inventor of the present invention discovered that the semiconductor layer 207 has high mobility.

Because the portion where the semiconductor layer 207 is formed not to get over the source electrode 205 and the drain electrode 206 is the gate insulation layer 204 in which a portion to be printed before/after the printing is flat, the printed film becomes highly flattened by leveling of the coating liquid and the flatness of the gate insulation film 204.

In this respect, it is known that the characteristics of the semiconductor layer depend on the crystallinity of the semiconductor layer. Because the portion where the semiconductor layer 207 is formed not to get over the source electrode 205 and the drain electrode 206 has high flatness, the crystallinity is high. Further, because the current flows though this portion, it is considered that the semiconductor layer 207 shows high mobility.

On the other hand, when the semiconductor layer is formed in a substantially stripe shape which is substantially parallel to a direction of the current that flows between the source electrode and the drain electrode, that is, when the semiconductor layer is formed to get over the source electrode and the drain electrode, failure of the coating liquid to become level due to the step formed by the electrode may occur or the flatness of the printed film may be lowered because the portion to be printed is changed to the gate insulation layer from the electrode, whereby the crystallinity or the mobility of the semiconductor layer is likely to decrease.

It should be noted that the current flows between the source electrode 205 and the drain electrode 206. Therefore, the substantially stripe shape formed orthogonally to a direction of the current that flows between the source electrode 205 and the drain electrode 206 (i.e., direction substantially parallel to the Y axis direction) becomes substantially parallel to the end portions of the source electrode 205 and the drain electrode 206. As a result, the semiconductor layer 7 can be formed not to get over the source electrode 205 and the drain electrode 206.

Meanwhile, because the substantially stripe shape formed to be substantially parallel to the direction of the current that flows between the source electrode and the drain electrode is orthogonal to the end portions of the source electrode and the drain electrode, the semiconductor layer is formed not to get over the source electrode 205 and the drain electrode 206.

The width of the semiconductor layer 207 having a substantially stripe shape is not specifically limited, however, in FIG. 15, because the portion exposed from under the semiconductor layer 207 (i.e., portion not covered by the protection layer 208) is removed, the semiconductor layer 207 may be formed extending to a portion to be electrically connected with the pixel electrode of the drain electrode 206 (i.e., portion in which the capacitive electrode 203 exists). However, when the semiconductor layer 207 is formed to have the width enabling contact with the semiconductor layer, the source electrode, the drain electrode and the pixel electrode in adjacent transistor element, the protection layer 208 is formed over the adjacent transistor elements. Therefore, the semiconductor layer 207 which is under the protection layer 208 may cause leak current between transistor elements being adjacent to each other. Thus, it is desirable that the width of the stripe-shaped semiconductor layer is less than or equal to a width not enabling contact with adjacent semiconductor layer, the source electrode and the drain electrode.

While the width of the semiconductor layer 207 should be small enough to avoid the above-mentioned problems and avoid wastage of material, the substantially stripe shape could be as wide as otherwise possible, to lower the required alignment accuracy.

Next, as shown in FIG. 15, the protection layer 8 that covers the thin film transistor 300 is preferably formed in a substantially stripe shape to orthogonally cross over a plurality of semiconductor layers 207. Thus, the characteristics of the semiconductor layer 207 are prevented from degrading, and the thin film transistor 300 can be manufactured to have excellent alignment accuracy and transistor elements capable of being electrically isolated easily.

The disadvantages when the protection layer is formed with a small dot as an isolation pattern and the advantages when the protection layer is formed in the stripe pattern are the same as the case of the protection layer as described in the first embodiment. The width of the stripe-shaped protection layer 208 is not specifically limited. However, it is preferable to have a width that avoids contact with the pixel electrode, and it is necessary that the protection layer 208 is formed at a position where at least the channel portion is covered.

In FIG. 15, assuming the protection layer 208 contacts with a portion to be electrically connected with the pixel electrode of the drain electrode 206 (i.e., portion in which the capacitive electrode 203 exists), an aperture ratio is likely to decrease or conduction with the pixel electrode is likely to be blocked. Further, a similar problem is likely to happen when the protection layer 208 is formed extending to a portion to be electrically connected with the pixel electrode of an adjacent drain electrode 206. Hence, as a width of the protection layer 208, it is desirable to set the width to be less than or equal to a width that avoids contact with the drain electrode 206 of the transistor 250 and the drain electrode 206 of an adjacent transistor 250.

While the width of the semiconductor layer 208 should be small enough to avoid the above-mentioned problems and avoid wastage of material, the substantially stripe shape should be as wide as otherwise possible, to lower the required alignment accuracy.

In FIG. 15, after forming the protection layer 208, a portion in the semiconductor layer 207 which is exposed from under the protection layer 208 is removed, thereby electrically isolating adjacent transistor elements 250 from each other. As a method of partly removing the semiconductor layer 207, for example, a method substantially identical to the method of partly removing the semiconductor layer 7 as described in the first embodiment is employed.

Further, a portion of the semiconductor layer 207 which is not covered by the protection layer 208 is not only removed, but also a process that deactivates the semiconductor properties to lose the conductivity may be used as well. At this point, needless to say, a processing that might remove the protection layer 208 is avoided.

These processes are applied to the substrate 201 on which the thin film transistor 300 is formed. Accordingly, compared to an isolation method of the transistor elements that requires alignments such as using a laser or erasing, electrical isolation between transistor elements can be produced easily. By these processes, locations at both ends of the semiconductor layer 207 in the Y-axis direction and locations at both ends of the protection layer 208 in the same direction are substantially identical in the planar view. In other words, when the tip of the semiconductor layer 207 in the Y-axis direction is defined as the end portion of the semiconductor layer 207, the end portion of the semiconductor layer 207 is formed to match the end portion of the protection layer 208 in the width direction (i.e., short side direction).

Effects of the Second Embodiment

According to the second embodiment of the present invention, in the process of manufacturing the thin film transistor 300, the semiconductor layer 207 is formed to be substantially parallel to the Y-axis direction and formed in substantially stripe shape over the forming region of the respective transistor elements 250, whereby the deviation of the alignment can be controlled using only one axis of the X-axis direction. Similarly, the protection layer 208 is formed to be substantially parallel to the X-axis direction and formed in a substantially stripe shape over the forming region of the respective transistor elements 250, whereby the deviation of the alignment can be controlled using only one axis direction of the Y-axis direction. Thus, the semiconductor layer 207 and the protection layer 208 can be formed with high accuracy.

Moreover, after forming the protection layer 208, a portion in the semiconductor layer 207 which is exposed from under the protection layer 208 is removed by using an organic solvent, inorganic solvent or a mixture of these solvents. Thus, electrical isolation between transistor elements 250 can more readily be produced as a self-alignment. Therefore, the thin film transistor 300 can more readily be manufactured with high precision. Specifically, the structure provides relatively superior alignment accuracy of the semiconductor layer.

(Modification)

In the second embodiment of the present invention, the modification as described in the first embodiment may be applied.

Figure 16:
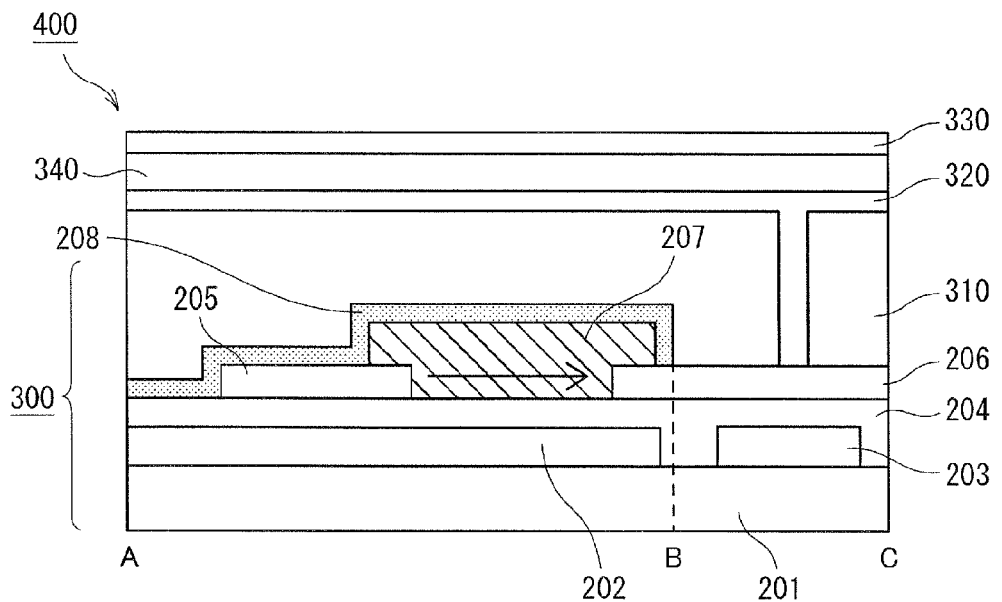
FIG. 16 is a cross-sectional view showing a configuration example of the image display apparatus 400 according to an embodiment of the present invention.

FIG. 16 is a cross-sectional view showing a configuration example of the image display apparatus 400 according to the second embodiment of the present invention. As shown in FIG. 16, the image display apparatus 400 is provided with, for example, the above-described thin film transistor (thin film transistor array) 300, an interlayer insulation film 310 formed on the thin film transistor 300, a pixel electrode 320 formed on the interlayer insulation film 310 and electrically connected to the drain electrode 206 and a display medium 340 including a common electrode 330 formed on the pixel electrode 320. As a display medium 340, for example, an electronic paper such as electrophoresis-type reflection display apparatus, an organic EL display apparatus, an inorganic EL display apparatus, a transmission-type liquid crystal display apparatus, a reflection-type liquid crystal display apparatus, a transflective liquid crystal display apparatus etc. can be used.

Comparative Embodiment

FIG. 17 is a planar view showing a configuration example of the thin film transistor 500 according to the comparative embodiment of the present invention. FIG. 18 is a cross-sectional view in which a portion 450 corresponding to one pixel (hereinafter referred to transistor element) is cut along a line A'-B'-C' in the thin film transistor as shown in FIG. 17. In FIG. 17, to avoid complicating the drawing, an illustration of the gate insulation layer 404 is omitted. Further, in FIG. 18, the A'-B' section and the B'-C' section which is orthogonal to the A'-B' section are illustrated schematically in a continuous section.

As shown in FIG. 17, the thin film transistor 500 according to the comparative embodiment of the present invention is provided with a plurality of transistor elements 450 arranged in a vertical direction and a horizontal direction when seen in planar view, with the same intervals, the plurality of transistor elements 450 being arranged on the same substrate. As shown in FIG. 18, each of the transistor elements 450 is a bottom gate/bottom contact type transistor and includes a gate electrode 402 and a capacitive electrode 403 that are formed on a substrate 401; a gate insulation layer 404 formed on the substrate 401, covering the gate electrode 402 and the capacitive electrode 403; a source electrode 405 and a drain electrode 406 that are formed on the gate insulation layer 404; a semiconductor layer 407 formed on the source electrode 405, the gate insulation layer 404 and the drain electrode 406, extending from the source electrode 405 to the drain electrode 406 along the gate insulation layer 4; and a protection layer 408 formed on the semiconductor layer 407. As shown in FIG. 17, in the thin film transistor 500, the semiconductor layer 407 and the protection layer 408 are formed in a substantially stripe shape substantially parallel to the X-axis direction. The semiconductor layer 407 and the protection layer 408 are arranged to be substantially parallel with each other and not to cross each other.

EXAMPLES

Example 1

The inventor of the present invention produced a thin film transistor array having isolated elements by forming the semiconductor layer 7 in a substantially stripe shape with a coating method as shown in FIG. 6 and the protection layer 8 in a substantially stripe shape which is orthogonal to the semiconductor layer 7 as shown in FIG. 7 and, removing a portion in the semiconductor layer 7 which is exposed from under the protection layer 8 (i.e., a portion not covered by the protection layer 8) (Example 1).

A manufacturing method of bottom gate/bottom contact type thin film transistor in Example 1 will now be described. First, as a material of the substrate 1, polyethylene naphthalate (PEN) with thickness 125 μm (product of Teijin Dupont) was employed.

Next, as a material for the gate electrode 2 and the capacitive electrode 3, nanosilver (product of Sumitomo Electric Industries) and nanosilver ink (product of Aldrich) in which weight ratio with respect to polyethylene glycol #200 is 8:1 were employed. The nanosilver ink was printed on a PEN substrate 1 by a reverse offset printing method and baked at 180 degrees C. for an hour so as to form the gate electrode 2. Subsequently, as a material for the gate insulation layer 4, a solution in which polyvinyl phenol (product of Aldrich) in an amount of 10 wt. % was dissolved into cyclohexanone was employed. The solution of the gate insulation layer 4 was coated by a die coater method and dried at 180 degrees C. for an hour for forming. Next, as a material for the source electrode 5 and the drain electrode 6, nanosilver (product of Sumitomo Electric Industries), nanosilver ink (product of Aldrich) in which weight ratio with respect to polyethylene glycol #200 is 8:1 were employed. The nanosilver ink was printed by the reverse offset printing method and dried at 180 degrees C. for an hour so as to form the source electrode 5 and the drain electrode 6.

Next, as a material for the semiconductor layer 7, a solution in which Lisicon SP200 (product of Merck) was dissolved into a tetralin (product of Kanto Chemical Co., Inc) so as to become 1.0 wt % was employed. Because the semiconductor layer 7 is formed by using the letterpress printing method, photosensitive resin letterpress as a letterpress and a 150 dpi anilox roll were used. The semiconductor layer 7 was printed by setting a solution of the semiconductor layer 7 to be in a horizontal direction with respect to a direction where the current flows through the channel portion and drying at 100 degrees C. for 60 minutes, whereby the semiconductor layer 7 is formed.

Subsequently, by using an ink in which 5 wt. % polyvinylalcohol (product of Aldrich) as a sealing material was dissolved into pure water, the protection layer 8 was formed in a direction orthogonal to the semiconductor layer 7.

Next, a portion in the semiconductor layer 7 which was not covered by the protection layer 8 was washed away with toluene so as to isolate the elements. In the Example 1, an Off state current (leak current) was able to be reduced.

Example 2

As for manufacturing steps up to a manufacturing step for forming the protection layer 8, exactly the same manufacturing steps as in Example 1 were used to produce the thin film transistor. Next, a portion in the semiconductor layer 7 which was not covered by the protection layer 8 was exposed to toluene vapor so as to isolate the elements (Example 2). In Example 2, the Off state current (leak current) was able to be reduced.

Example 3

As a material for the semiconductor layer 7, an In—Ga—Zn—O based oxide solution was employed. Because the semiconductor layer 7 is formed by using the letterpress printing method, photosensitive resin letterpress as a letterpress and a 150 dpi anilox roll were used. The semiconductor layer 7 was printed by setting a solution of the semiconductor layer 7 to be in a horizontal direction with respect to a direction where the current flows through the channel portion and applying an annealing at 350 degrees C. for 30 minutes by a hotplate, whereby the semiconductor layer 7 is formed. In the forming processes up to the protection layer 8, exactly the same manufacturing steps as in Example 1 except for the forming process of the semiconductor layer 7 were applied so as to form the thin film transistor. Next, a portion in the semiconductor layer 7 which was not covered by the protection layer 8 was washed away by hydrochloric acid so as to isolate the elements (Example 3). In Example 3, the Off state current (leak current) was able to reduced.

Example 4

As for manufacturing steps up to a manufacturing step for forming the protection layer 8, exactly the same manufacturing steps as in Example 3 were used to produce the thin film transistor. Next, a portion in the semiconductor layer 7 which was not covered by the protection layer 8 was exposed to hydrochloric acid vapor so as to isolate the elements (Example 4). In Example 4, the Off state current (leak current) was able to be reduced.

Comparative Example 1

The same manufacturing steps as in Example 1 were applied up to forming the stripe-shaped protection layer 8. In comparative Example 1, the portion in the semiconductor layer 7 which was not covered by the protection layer 8 was not removed so that the isolation between the elements was not performed. In Comparative Example 1, the Off state current (leak current) became high.

Comparative Example 2

As for manufacturing steps up to a manufacturing step for forming the protection layer 8, exactly the same manufacturing steps as in Example 3 were used to produce the thin film transistor. In Comparative Example 2, the portion in the semiconductor layer 7 which was not covered by the protection layer 8 was not removed so that the isolation between the elements was not performed. In Comparative Example 2, the Off state current (leak current) became high.

Result of the First Example

As described, according to the Examples 1 to 4, the semiconductor layer 7 was formed in a substantially stripe shape by the coating method and after forming the protection layer 8 to be in a direction orthogonal to the semiconductor layer 7 by the coating method, the portion in the semiconductor layer 7 which was not covered by the protection layer 8 was removed by any of an organic solvent, inorganic solvent or mixed solvent thereof. Thus, compared to the Comparative Examples 1 and 2, the semiconductor layer 7 and the protection layer 8 were formed with excellent alignment accuracy and the isolation between the transistor elements 50 was accomplished by a simple method, whereby the thin film transistor 100 having excellent device characteristics was produced.

Second Example

Example 5

The inventor of the present invention produced a thin film transistor array having isolated elements by forming the semiconductor layer 207 in a substantially stripe shape with a coating method as shown in FIG. 14 and the protection layer 208 in a substantially stripe shape which was orthogonal to the semiconductor layer 207 as shown in FIG. 15, and removing a portion in the semiconductor layer 207 which was exposed from under the protection layer 208 (i.e., a portion not covered by the protection layer 208) (Example 5).

A manufacturing method of a bottom gate/bottom contact type thin film transistor in the Example 5 will now be described. First, as a material of the substrate 201, polyethylene naphthalate (PEN) with thickness 125 µm (product of Teijin Dupont) was employed. Next, as a material for the gate electrode 202 and the capacitive electrode 203, nanosilver (product of Sumitomo Electric Industries) and nanosilver ink (product of Aldrich) in which the weight ratio with respect to polyethylene glycol #200 is 8:1 were employed. The nanosilver ink was printed on a PEN substrate 201 by a reverse offset printing method and baked at 180 degrees C. for an hour so as to form the gate electrode 202.

Subsequently, as a material for the gate insulation layer 204, a solution in which polyvinyl phenol (product of Aldrich) in an amount of 10 wt. % was dissolved into cyclohexanone was employed. The solution of the gate insulation layer 4 was coated by a die coater method and dried at 180 degrees C. for an hour for forming.

Next, as a material for the source electrode 205 and the drain electrode 206, nanosilver (product of Sumitomo Electric Industries), nanosilver ink (product of Aldrich) in which the weight ratio with respect to polyethylene glycol #200 is 8:1 were employed. The nanosilver ink was printed by the reverse offset printing method and dried at 180 degrees C. for an hour so as to form the source electrode 205 and the drain electrode 206.

Next, as a material for the semiconductor layer 207, a solution in which Lisicon SP200 (product of Merck) was dissolved into tetralin (product of Kanto Chemical Co., Inc) so as to become 1.0 wt % was employed. Because the semiconductor layer 207 is formed by using the letterpress printing method, photosensitive resin letterpress as a letterpress and a 150 dpi anilox roll were used. The semiconductor layer 207 was printed by setting a solution of the semiconductor layer 7 to be in a horizontal direction with respect to a direction where the current flows through the channel portion and drying at 100 degrees C. for 30 minutes, whereby the semiconductor layer 207 is formed.

Subsequently, by using an ink containing 5 wt. % polyvinylalcohol (product of Aldrich) dissolved in pure water as a sealing material, the protection layer 208 was formed in a direction orthogonal to the semiconductor layer 207.

Next, a portion in the semiconductor layer 207 which was not covered by the protection layer 208 was washed away by the toluene so as to isolate the elements. In Example 5, an Off state current (leak current) was able to be reduced.

Example 6

As for manufacturing steps up to a manufacturing step for forming the protection layer 208, exactly the same manufacturing steps as in Example 5 were used to produce the thin film transistor. Next, a portion in the semiconductor layer 207 which was not covered by the protection layer 208 was exposed to toluene vapor so as to isolate the elements (Example 6). In Example 6, the Off state current (leak current) was able to be reduced.

Example 7

As a material for the semiconductor layer 207, an In—Ga—Zn—O based oxide solution was employed. Because the semiconductor layer 207 is formed by using the letterpress printing method, photosensitive resin letterpress as a letterpress and a 150 dpi anilox roll were used. The semiconductor layer 207 was printed by setting a solution of the semiconductor layer 207 to be in a horizontal direction with respect to a direction where the current flows through the channel portion and applying an annealing at 350 degrees C. for 30 minutes by a hotplate, whereby the semiconductor layer 207 is formed. In the forming processes up to the protection layer 208, exactly the same processes as in Example 5 except for forming process of the semiconductor layer 207 were applied so as to form the thin film transistor. Next, a portion in the semiconductor layer 207 which was not covered by the protection layer 208 was washed away with hydrochloric acid so as to isolate the elements (Example 7). In the Example 7, the Off state current (leak current) was able to be reduced.

Example 8

As for manufacturing steps up to a manufacturing step for forming the protection layer 208, exactly the same manufacturing steps as in Example 7 were used to produce the thin film transistor. Next, a portion in the semiconductor layer 207 which was not covered by the protection layer 208 was exposed to hydrochloric acid vapor so as to isolate the elements (Example 8). In Example 8, the Off state current (leak current) was able to be reduced.

Comparative Example 5

The same manufacturing steps as in Example 5 were used up to the manufacturing step for forming the stripe-shaped protection layer 208. In the Comparative Example 5, the portion of the semiconductor layer 207 which was not covered by the protection layer 208 was not removed so that the isolation between the elements was not performed. In the Comparative Example 5, the Off state current (leak current) became high.

Comparative Example 6

As for manufacturing steps up to a manufacturing step for forming the protection layer 208, exactly the same manufacturing steps as in Example 7 were used to produce the thin film transistor. In the Comparative Example 6, the portion in the semiconductor layer 207 which was not covered by the protection layer 208 was not removed so that the isolation between the elements was not performed. In the Comparative Example 6, the Off state current (leak current) became high.

Result of the Second Example

As described, according to Examples 5 to 8, the semiconductor layer 207 was formed in the substantially stripe shape by a coating method and after forming the protection layer 208 to be in a direction orthogonal to the semiconductor layer 207 by the coating method, the portion in the semiconductor layer 207 which was not covered by the protection layer 208 was removed by any of the organic solvent, the inorganic solvent or the mixed solvent thereof. Thus, compared to the Comparative Examples 5 and 6, the semiconductor layer 207 and the protection layer 208 were formed with excellent alignment accuracy and the isolation between the transistor elements 250 was accomplished by a simple method, whereby the thin film transistor 300 having excellent device characteristics was produced.

INCORPORATION BY REFERENCE AND REPRESENTATIVE SCOPE

The entire contents of Japanese Patent Application No. 2012-208496 (filed on Sep. 21, 2012) and Japanese Patent Application No. 2012-208497 (filed on Sep. 21, 2012) to which the present application claims the benefit of priority are hereby incorporated by reference herein in their entirety as a part of the present disclosure.

In the present disclosure, description is given with reference to a limited number of embodiments, however, the scope of rights is not limited thereto and modifications of the respective embodiments based on the above-described disclosure are obvious for the person skilled in the art.

REFERENCE SIGNS LIST 1, 201, 401 substrate
2, 202, 402 gate electrode
3, 203, 403 capacitive electrode
4, 204, 404 gate insulation layer
5, 205, 405 source electrode
6, 206, 406 drain electrode
7, 207, 407 semiconductor layer
7a, 207a channel portion
8, 208, 408 protection layer
50, 250, 450 transistor element
100, 300, 500 thin film transistor
110, 310 interlayer insulation film
120, 320 pixel electrode
130, 330 common electrode
140, 340 display medium
200, 400 image display apparatus

What is claimed is:

1. A thin film transistor including a substrate and a plurality of transistor elements formed on the substrate, each of the transistor elements comprising:
   a gate electrode formed on the substrate;
   a gate insulation layer formed on the substrate, covering the gate electrode;
   a source electrode and a drain electrode which are formed on the gate insulation layer;
   a semiconductor layer formed on the source electrode, the gate insulation layer and the drain electrode, extending from the source electrode to the drain electrode along the gate insulation layer; and
   a protection layer formed on the semiconductor layer,
   wherein the protection layer is formed in a substantially stripe shape over each of the transistor elements, and when seen in planar view, locations at both ends of the semiconductor layer and locations at both ends of the protection layer are substantially identical in a channel-length direction extending from the source electrode to the drain electrode in each of the transistor elements, and
   wherein the protection layer is made of a mixture containing an inorganic compound and an organic compound.

2. The thin film transistor of claim 1, wherein the semiconductor layer is made of an organic semiconductor material.

3. The thin film transistor of claim 1, wherein the semiconductor layer is made of an oxide semiconductor material.

4. The thin film transistor of claim 1, wherein the protection layer is made of an inorganic compound.

5. The thin film transistor of claim 1, wherein the protection layer is made of an organic compound.

6. An image display apparatus characterized in that the apparatus comprises:
   a thin film transistor according to claim 1;
   an interlayer insulation film formed on the thin film transistor;

a pixel electrode formed on the interlayer insulation film and electrically connected to the drain electrode; and a display medium including a common electrode formed on the pixel electrode.

7. The image display apparatus of claim 6, wherein the display medium is any one of an electrophoresis-type reflection display apparatus, a transmission-type liquid crystal display apparatus, a reflection-type liquid crystal display apparatus, a transflective liquid crystal display apparatus, an organic EL display apparatus and an inorganic EL display apparatus.

8. A thin film transistor including a substrate and a plurality of transistor elements formed on the substrate, each of the transistor elements comprising:

a gate electrode formed on the substrate;

a gate insulation layer formed on the substrate, covering the gate electrode;

a source electrode and a drain electrode which are formed on the gate insulation layer;

a semiconductor layer formed on the source electrode, the gate insulation layer and the drain electrode, extending from the source electrode to the drain electrode along the gate insulation layer; and a protection layer formed on the semiconductor layer, wherein the protection layer crosses a channel-length direction extending from the source electrode to the drain electrode in each of the transistor elements when seen in planar view, the protection layer being formed in a substantially stripe shape over each of the transistor elements, and locations at both ends of the semiconductor layer and locations at both ends of the protection layer are substantially identical in the channel-length direction when seen in planar view, and wherein the protection layer is made of a mixture containing an inorganic compound and an organic compound.

9. A thin film transistor including a substrate and a plurality of transistor elements formed on the substrate, each of the transistor elements comprising:

a gate electrode formed on the substrate;

a gate insulation layer formed on the substrate, covering the gate electrode;

a source electrode and a drain electrode which are formed on the gate insulation layer;

a semiconductor layer formed on the source electrode, the gate insulation layer and the drain electrode, extending from the source electrode to the drain electrode along the gate insulation layer; and a protection layer formed on the semiconductor layer, wherein the protection layer is formed to be substantially parallel to a channel-length direction extending from the source electrode to the drain electrode in each of the transistor elements, the protection layer being formed in a substantially stripe shape over each of the transistor elements, and locations at both ends of the semiconductor layer and locations at both ends of the protection layer are substantially identical in a direction that crosses the channel-length direction when seen in planar view wherein the protection layer is made of a mixture containing an inorganic compound and an organic compound.

10. A method of manufacturing a thin film transistor including a plurality of transistor elements formed on a substrate, the method comprising:

a step for forming a gate electrode on the substrate;

a step for forming a gate insulation layer so as to cover the gate electrode;

a step for forming a source electrode and a drain electrode on the gate insulation layer;

a step for forming a semiconductor layer on the source electrode, the gate insulation layer and the drain electrode, to be extended from the source electrode to the drain electrode along the gate insulation layer;

a step for forming a protection layer on the semiconductor layer; and a step for partly removing the semiconductor layer so as to produce electrical isolation between each of the transistor elements, wherein in the step for forming the semiconductor layer, the semiconductor layer is formed in a substantially stripe shape to bridge across a forming region of each of the transistor elements, in the step for forming the protection layer, the protection layer is formed to cross the semiconductor layer when seen in planar view and formed in a substantially stripe shape over the forming region of each of the transistor elements and in the step for partly removing the semiconductor layer, the semiconductor layer is etched by using a protection layer as a mask, and wherein the protection layer is made of a mixture containing an inorganic compound and an organic compound.

11. The method of claim 10, wherein the semiconductor layer is formed to be substantially parallel to a channel-length direction that extends from the source electrode to the drain electrode in each of the transistor elements.

12. The method of claim 10, wherein the semiconductor layer is formed to cross, when seen in planar view, a channel-length direction that extends from the source electrode to the drain electrode in each of the transistor elements.

13. The method of claim 10, wherein the protection layer is formed by a coating method.

14. The method of claim 10, wherein the semiconductor layer is washed away by an organic solvent, an inorganic solvent or a mixed solvent thereof in the step for partly removing the semiconductor layer.

15. The method of claim 10, wherein the semiconductor layer is removed by being exposed to vapor of any solvent from among an organic solvent, an inorganic solvent and a mixed solvent thereof in the step for partly removing the semiconductor layer.

16. The method of claim 10, wherein the semiconductor layer is formed by a coating method.

17. The method of claim 16, wherein the coating method is any one of letterpress printing, intaglio printing, lithographic printing, reverse offset printing, screen printing, inkjet, thermal transfer printing, dispenser, spin coating, die coating, microgravure coating and dip coating.

* * * * *